US009036959B2

(12) United States Patent
Assefa et al.

(10) Patent No.: US 9,036,959 B2
(45) Date of Patent: May 19, 2015

(54) INTERGRATING A SILICON PHOTONICS PHOTODETECTOR WITH CMOS DEVICES

(71) Applicant: International Business Machines Corporation, Armonk, NY (US)

(72) Inventors: Solomon Assefa, Ossining, NY (US); Marwan H. Khater, Astoria, NY (US); Edward W. Kiewra, South Burlington, VT (US); Steven M. Shank, Jericho, VT (US)

(73) Assignee: International Business Machines Corporation, Armonk, NY (US)

( * ) Notice: Subject to any disclaimer, the term of this patent is extended or adjusted under 35 U.S.C. 154(b) by 207 days.

(21) Appl. No.: 13/732,494

(22) Filed: Jan. 2, 2013

(65) Prior Publication Data
US 2014/0185981 A1   Jul. 3, 2014

(51) Int. Cl.
G02B 6/136 (2006.01)
H01L 33/52 (2010.01)
G06F 17/50 (2006.01)
H01L 27/14 (2006.01)

(52) U.S. Cl.
CPC ............ H01L 33/52 (2013.01); G06F 17/5068 (2013.01); H01L 27/14 (2013.01)

(58) Field of Classification Search
USPC .................... 385/12–14, 16; 438/154, 202
See application file for complete search history.

(56) References Cited

U.S. PATENT DOCUMENTS

| 6,156,594 A * | 12/2000 | Gris .............................. 438/202 |
| 7,262,117 B1 | 8/2007 | Gunn, III et al. |
| 7,790,495 B2 | 9/2010 | Assefa et al. |
| 8,183,516 B2 | 5/2012 | Augusto |
| 2010/0038689 A1 | 2/2010 | Ahn et al. |
| 2010/0059822 A1 | 3/2010 | Pinguet et al. |
| 2011/0027950 A1 | 2/2011 | Jones et al. |
| 2012/0129302 A1* | 5/2012 | Assefa et al. ................. 438/154 |

OTHER PUBLICATIONS

International Search Report and Written Opinion, Apr. 10, 2014, PCT/US14/10064.
S. J. Koester et al., "Germanium-on-SOI Infrared Detectors for Integrated Photonic Applications," IEEE Journal of Selected Topics in Quantum Electronics, vol. 12, Issue 6, Nov.-Dec. 2006, pp. 1489-1502.

(Continued)

*Primary Examiner* — Akm Enayet Ullah
(74) *Attorney, Agent, or Firm* — Steven M. Kellner; Michael Lestrange

(57) ABSTRACT

A method of forming an integrated photonic semiconductor structure having a photonic device and adjacent CMOS devices may include depositing a first silicon nitride layer over the adjacent CMOS devices and depositing an oxide layer over the first silicon nitride layer, wherein the oxide layer conformally covers the first silicon nitride layer and the underlying adjacent CMOS devices to form a substantially planarized surface over the adjacent CMOS devices. A second silicon nitride layer is then deposited over the oxide layer and a region corresponding to forming the photonic device. A germanium layer is deposited over the oxide layer and the region corresponding to forming the photonic device. The germanium layer deposited over the adjacent CMOS devices is etched to form a germanium active layer within the photonic region, whereby the oxide layer and the second silicon nitride layer protect the adjacent CMOS devices during the etching of the germanium.

22 Claims, 31 Drawing Sheets

(56) References Cited

OTHER PUBLICATIONS

K.-W. Ang et al., "Low Thermal Budget Monolithic Integration of Evanescent Coupled Ge-on-SOI Photodetector on Si CMOS Platform," IEEE Journal of Selected Topics in Quantum Electronics, Volume . No. 10, Jan./Feb. 2010, pp. 106-112.

J. Wang et al., "Ge-Photodetectors for Si-Based Optoelectronic Integration," Sensors, vol. 11, No. 1, 2011, pp. 696-718.

S. Assefa et al., "20Gbps Receiver Based on Germanium Photodetector Hybrid-Integrated with 90nm CMOS Amplifier," CLEO: Applications and Technology (CLEO: A and T), May 1, 2011, 2 pages.

Pending U.S. Appl. No. 12/951,597, filed Nov. 22, 2010, "Fabricating Photonics Devices Fully Integrated Into a CMOS Manufacturing Process".

* cited by examiner

INTERGRATING A SILICON PHOTONICS PHOTODETECTOR WITH CMOS DEVICES

BACKGROUND a. Field of the Invention

The present invention generally relates to semiconductor devices, and particularly to integrated photonic semiconductor devices.

b. Background of Invention

The use of both photonic devices in high-speed switching and transceiver devices in data communications are but a few examples that highlight the advantages of processing both optical and electrical signals within a single integrated device. For example, an integrated photonic device may include both photodetector and CMOS type devices that may be fabricated on a single silicon substrate. However, during the fabrication process, certain processes, while benefiting or being necessary for the formation and/or operation of one type of device (e.g., CMOS FET), may be detrimental to the formation and/or operation of the other type of device (e.g., Photodetector).

It may therefore, among other things, be advantageous to maintain, within an integrated photonic device, the integrity of both photonic and non-photonic type devices during fabrication processes.

BRIEF SUMMARY

According to at least one exemplary embodiment, a method of forming an integrated photonic semiconductor structure having a photonic device and adjacent CMOS devices may include depositing a first silicon nitride layer over the adjacent CMOS devices and depositing an oxide layer over the first silicon nitride layer, whereby the oxide layer conformally covers the first silicon nitride layer and the adjacent CMOS devices to form a substantially planarized surface over the adjacent CMOS devices. A second silicon nitride layer is deposited over the oxide layer and a region corresponding to forming the photonic device. A germanium layer is then deposited over the oxide layer and the region corresponding to forming the photonic device. The germanium layer deposited over the adjacent CMOS devices is etched thereby forming a germanium active layer within the region corresponding to forming the photonic device. The oxide layer and the second silicon nitride layer protect the adjacent CMOS devices during the etching of the germanium.

According to at least one other exemplary embodiment, a method of forming an integrated photonic semiconductor structure having a photonic device and adjacent CMOS devices may include depositing an oxide layer over a spacer layer corresponding to the adjacent CMOS devices, whereby the oxide layer conformally covers the spacer layer and the adjacent CMOS devices to form a substantially planarized surface over the adjacent CMOS devices. A silicon nitride layer is deposited over the oxide layer and a region corresponding to forming the photonic device. A germanium layer is then deposited over the oxide layer and the region corresponding to forming the photonic device. The germanium layer deposited over the adjacent CMOS devices is etched to create a germanium active layer within the region corresponding to forming the photonic device such that the oxide layer protects the adjacent CMOS devices during the etching of the germanium.

According to another exemplary embodiment, an integrated photonic semiconductor structure may include a substrate, a photonic device located on the substrate, the photonic device having an active region, and a first silicon nitride layer located on the substrate between the active region and an optical waveguide within the substrate, whereby the first silicon nitride layer mitigates intermixing between the active region and the optical waveguide. The structure further includes adjacent CMOS devices located on the substrate and electrically isolated from the photonic device. Encapsulating layers are located over the active region and encapsulate the active region. A second silicon nitride layer is located on the substrate that covers at least one of the adjacent CMOS devices and the encapsulating layers, such that the second silicon nitride layer protects the at least one of the adjacent CMOS devices and the encapsulating layers during silicide processes. The first and the second silicon nitride layer are separated from each other on the substrate.

BRIEF DESCRIPTION OF THE SEVERAL VIEWS OF THE DRAWINGS

FIGS. 2A-2L are vertical cross-sectional views of an integrated photonic semiconductor device structure illustrating the preservation of Ge layer deposition conformity over the CMOS devices according to a first embodiment;

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

The following structure and processes provide exemplary embodiments of a CMOS integrated nanophotonics device that includes, for example, both a photonic device such as a germanium (Ge) photodetector and CMOS devices such as adjacent FET transistors. Within CMOS integrated nanophotonic circuits, crystalline materials such as germanium or III-V compounds may be utilized as an active element of the photodetector component based on their high quantum efficiency. Using a rapid melt growth technique, films (e.g., germanium) can be deposited at low temperatures in an amorphous state using techniques such as physical vapor deposition (PVD), plasma enhanced chemical vapor deposition (PECVD), and rapid thermal chemical vapor deposition (RTCVD), and subsequently crystallized thermally. During the crystallization process, the germanium material forming the photodetector active region may be encapsulated, using a multi-layer film stack, in order to prevent crystalline defects and contamination as a result of outdiffusion. However, the deposition of the active region Ge material prior to encapsulation and crystallization of the photodetector may create gaps in the deposited Ge layer in a region over the adjacent FET transistors. These gaps may be caused by a lack of conformity in the deposited Ge layer, which may in turn degrade the underlying structure of the FET transistors. Thus, device integration processes utilizing CMOS device protective layers for preserving the structural integrity of CMOS devices during photonic device formation is described.

Figure 1A:
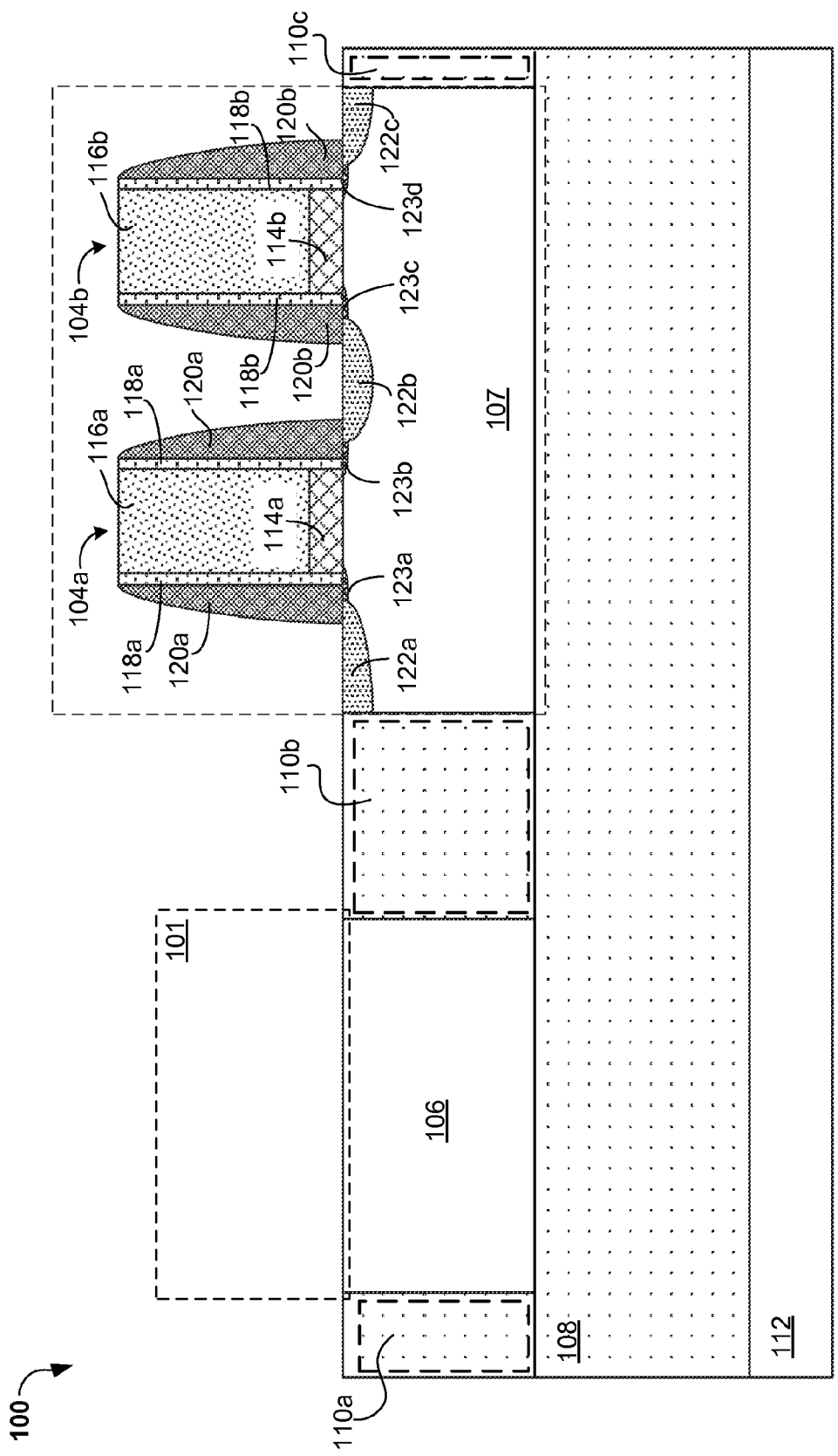
FIGS. 1A-1H are vertical cross-sectional views of an integrated photonic semiconductor device structure according to an exemplary embodiment, which illustrates the formation of a gap or void over the CMOS device region of the structure during Germanium (Ge) layer formation.

FIGS. 1A-1H are vertical cross-sectional views of an integrated photonic semiconductor device structure according to an exemplary embodiment, which illustrates the formation of a gap or void over the CMOS device region of the structure during Germanium (Ge) layer formation. Referring to FIG. 1A, an integrated photonic semiconductor structure 100 is illustrated. The integrated photonic semiconductor structure 100 may include a photonic device formation region 101 for fabricating, for example, a Germanium (Ge) photodetector (FIG. 1E: photodetector 102) and adjacent CMOS devices such as adjacent FET transistors 104a and 104b. The integrated photonic semiconductor structure 100 may further include an optical waveguide structure 106, a buried oxide (BOX) region 108, shallow trench isolation (STI) regions 110a-110c, and a silicon substrate 112. The BOX region 108 is located over the silicon substrate 112. The optical waveguide structure 106 may be formed within a silicon-on-insulator (SOI) layer (not shown) of structure 100, whereby the STI regions 110a-110b and BOX region 108 surrounding the waveguide 106 facilitate optical confinement (i.e., cladding) and low-loss waveguiding. In addition, STI region 110b may provide electrical isolation between a subsequently formed Germanium (Ge) photodetector within region 101 and the FET transistors 104a and 104b.

As depicted, CMOS FET transistor 104a may include a gate dielectric 114a, a polysilicon gate 116a, spacer oxide regions 118a, spacer nitride regions 120a, source/drain (S/D) regions 122a, 122b, and halo and extension implants 123a and 123b. Similarly, CMOS FET transistor 104b may include a gate dielectric 114b, a polysilicon gate 116b, spacer oxide regions 118b, spacer nitride regions 120b, source/drain (S/D) regions 122b, 122c, and halo and extension implants 123c and 123d. Well region 107, the S/D regions 122a-122c, and the halo and extension implants 123a-123d of FET transistors 104a and 104b are also formed within the silicon-on-insulator (SOI) layer (not shown). As depicted in the exemplary embodiment, S/D region 122b is shared between FET transistors 104a and 104b.

Figure 1B:
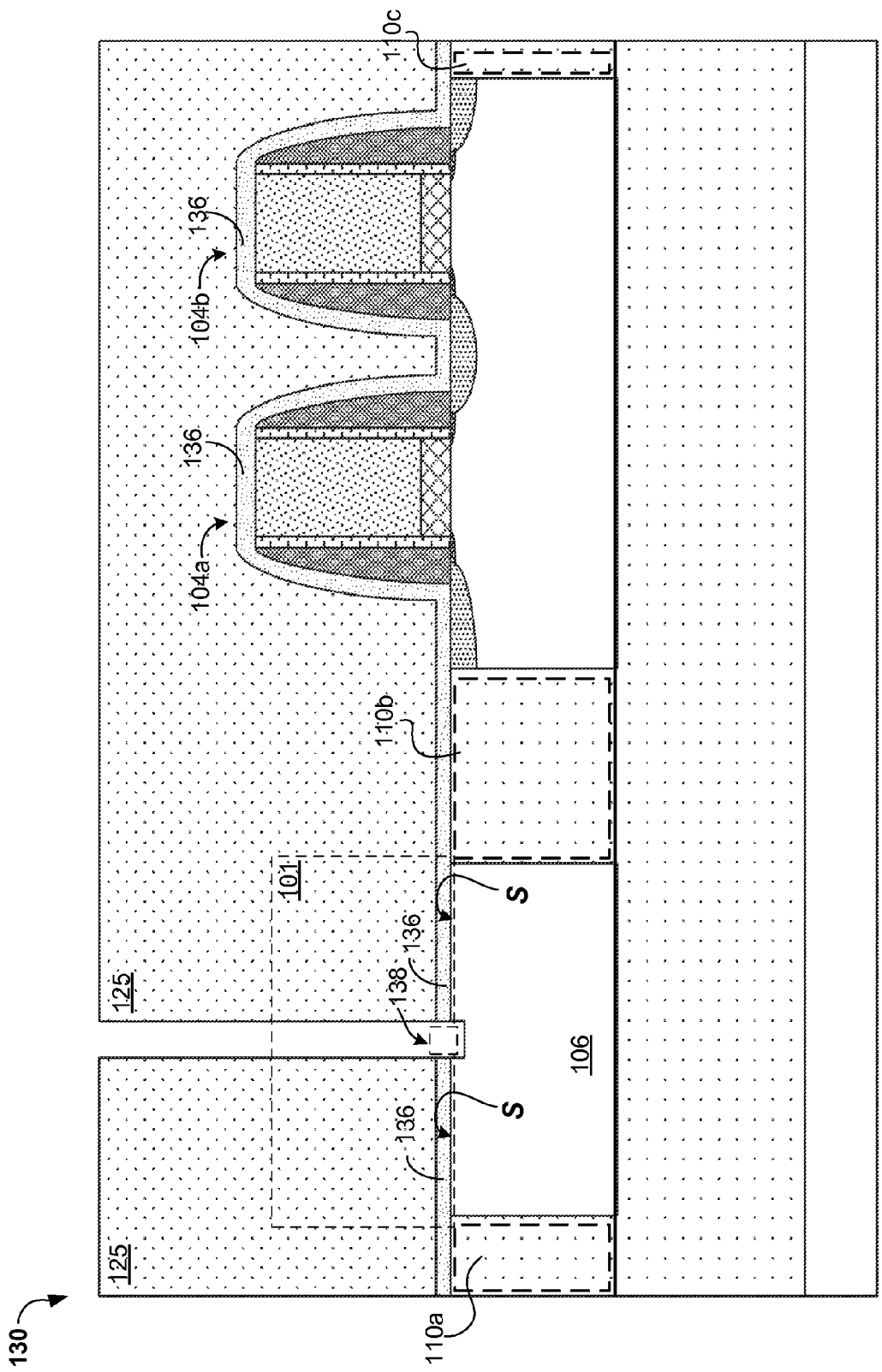

Referring to FIG. 1B, fabrication of integrated photonic device structure 130 includes the formation of a Ge crystallization window region within structure 100 of FIG. 1A. Prior to creating the crystallization window, a silicon nitride layer 136 of approximately 500 Å or less may be formed over the surface S of the photonic device formation region 101, the STI regions 110a-110c, and the CMOS FET transistors 104a, 104b. As depicted, an opening 138 may be formed within the silicon nitride layer 136 and a surface portion of the optical waveguide 106 by photolithographically patterned resist layer 125. During the subsequent formation of a Ge active region 132 (see FIG. 1E), a portion of the Ge active region fills opening 138 in order for the Ge active region 132 to establish contact with the silicon material of optical waveguide 106. Such contact may enable the Ge active region 132 to utilize the silicon material of optical waveguide 106 as a seed layer during the crystallization process of the Ge active region at a later process stage.

Figure 1C:
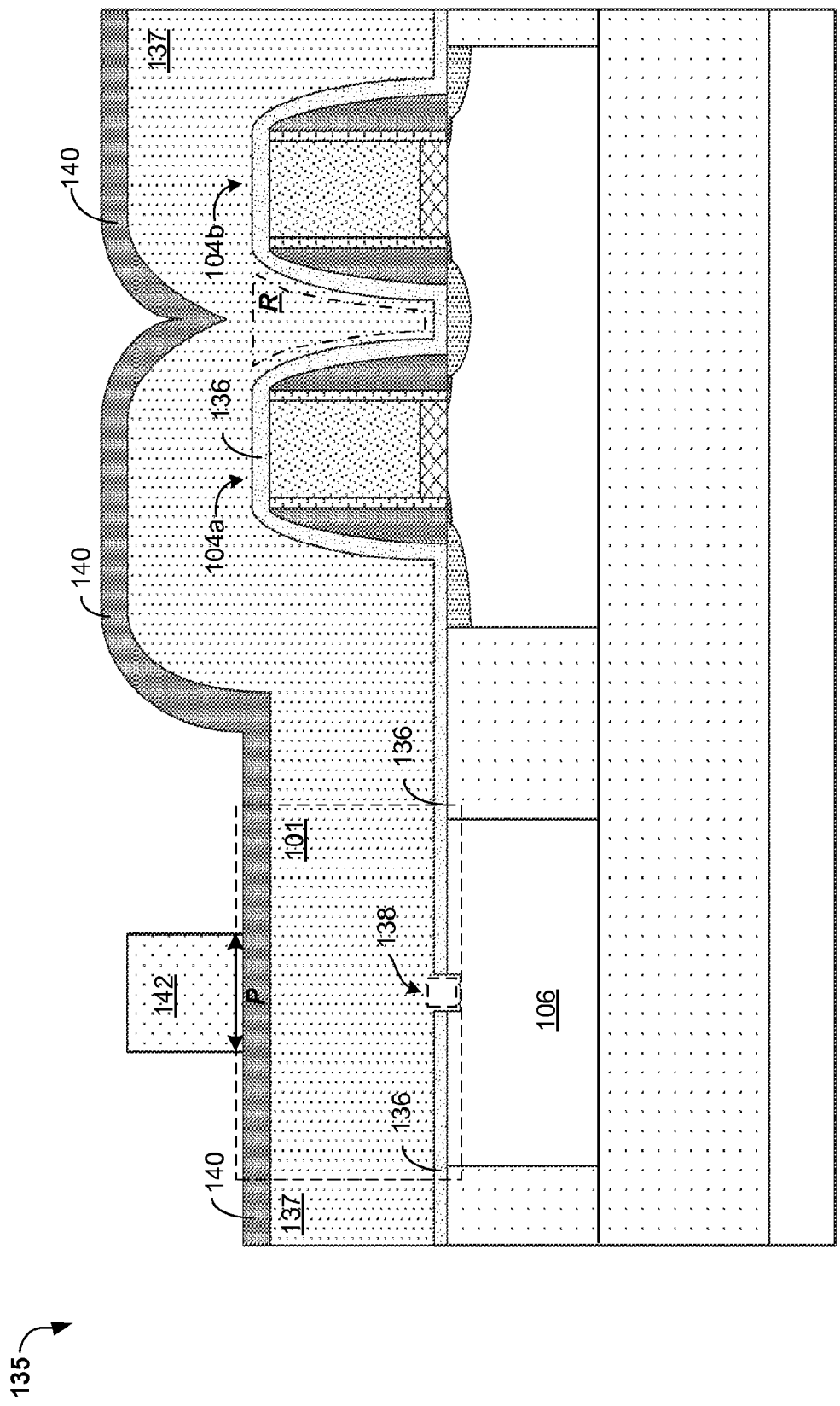

As shown in FIG. 1C, fabrication of integrated photonic device structure 135 includes the formation of a deposited Ge layer over structure 130 of FIG. 1B. In the illustrated embodiment, upon removal of the patterned resist layer 125 (FIG. 1B), a PECVD deposition method may be used to deposit a layer of germanium (Ge) 137 both within opening 138 and over silicon nitride layer 136. A silicon nitride ($Si_3N_4$) hard mask layer 140 is also formed over the top surface of the GE layer 137. A photolithographically patterned resist layer 142 is then formed on the hard mask layer 140 over portion P of the photonic device formation region 101. Based on the PECVD deposition method used, the Ge layer 137 is deposited with relatively good conformity, such that no gaps or voids are created as a result of depositing Ge material in the narrowly spaced region R located between FET transistors 104a and 104b. For example, the pitch between the gates of the FET transistors 104a, 104b may be in the region of about 0.14 μm or less.

Figure 1D:
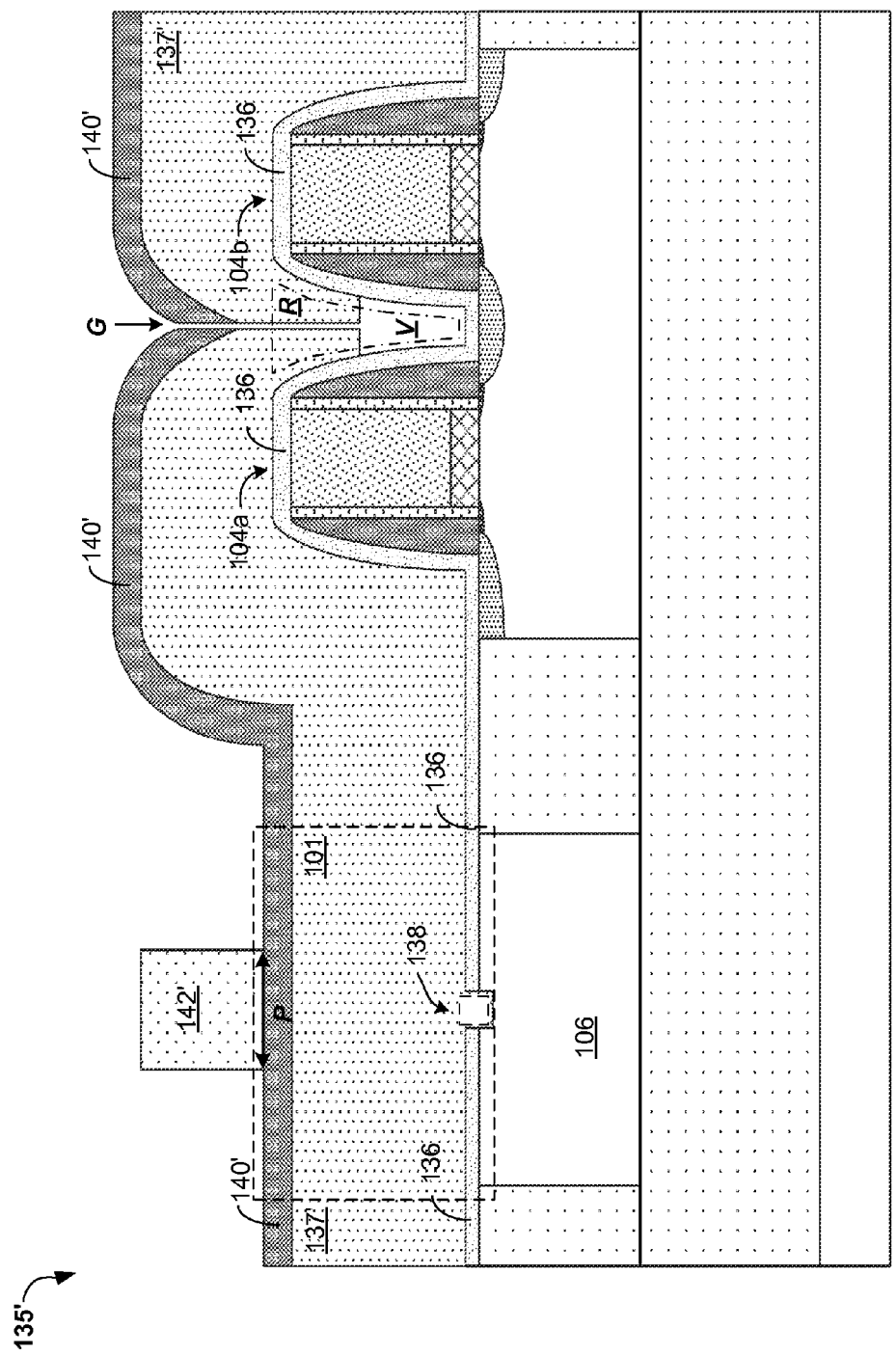

As shown in FIG. 1D, fabrication of integrated photonic device structure 135' includes the formation of a deposited Ge layer over structure 130 of FIG. 1B using a different deposition method. Referring to FIG. 1D, following the removal of the patterned resist layer 125 (FIG. 1B), a PVD deposition method (e.g., sputter PVD) may be used to deposit a layer of germanium (Ge) 137' both within opening 138 and over silicon nitride layer 136. Likewise, a silicon nitride ($Si_3N_4$) hard mask layer 140' is also formed over the top surface of the Ge layer 137'. A photolithographically patterned resist layer 142' is then formed over portion P' of the photonic device formation region 101. However, in contrast with FIG. 1C, based on the PVD deposition method used, the Ge layer 137' is deposited with relatively poor conformity, such that a gap G and void V are created within the deposited Ge layer in the narrowly spaced region R located between FET transistors 104a and 104b. As previously described, the pitch between the gates of the FET transistors 104a, 104b may be in the region of about 0.14 μm or less. It may be appreciated that PVD deposition conformity degrades with decreases in the pitch between the gates of the FET devices. Although, PVD provides less conformity relative to CVD deposition processes, PVD is a less costly deposition technique.

Figure 1E:
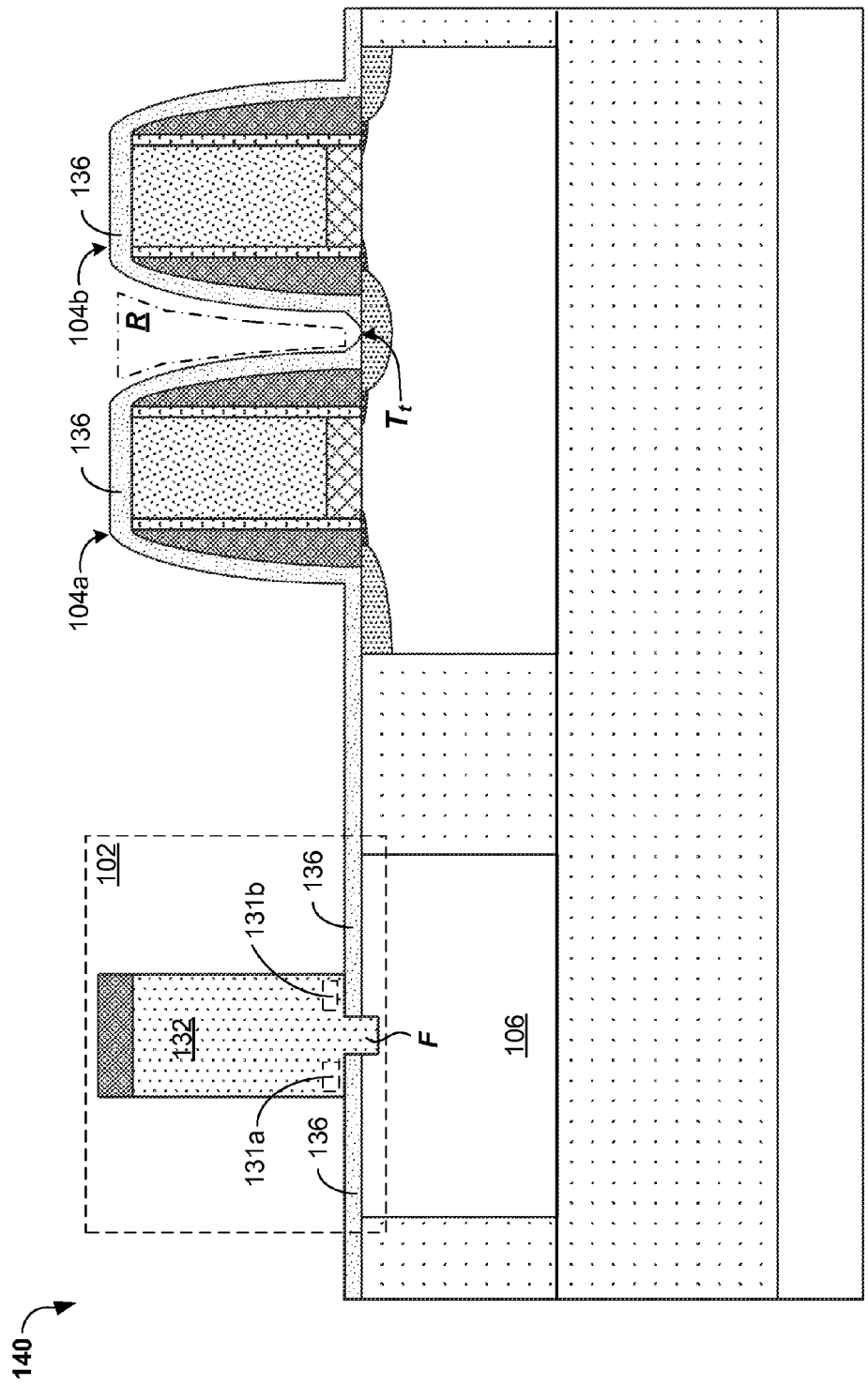

FIGS. 1E-1H illustrate the occurrence of structural degradation within the FET transistors 104a, 104b during subsequent process steps based on the poor conformity of the deposited GE layer 137' depicted in structure 135' of FIG. 1D. Referring to FIG. 1E, the fabrication of integrated photonic device structure 140 includes the formation of GE active region 132 by etching the GE layer 137' (FIG. 1D) of structure 135' (FIG. 1D). The region of the Ge layer 137' (FIG. 1D) located under photo resist layer 142' (FIG. 1D) remains to form Ge active region 132, while the remaining Ge material is etched away. As depicted, during the etch process, etch gas may pass through the gap G (FIG. 1D) and void V (FIG. 1D) causing some thinning of the silicon nitride layer 136, as defined by $T_t$, within the narrowly spaced region R located between FET transistors 104a and 104b.

As illustrated, portion F of the bottom portion of the Ge active region 132 acts as a seed layer by contacting the silicon material of the optical waveguide 106. The remaining regions 131a, 131b of the bottom portion of Ge active region 132 may be isolated from the silicon optical waveguide 106 by the silicon nitride layer 136. The isolation between the remaining portions 131a, 131b of the Ge active region 132 and the silicon optical waveguide 106 may facilitate the avoidance of the intermixing of germanium from the Ge active region 132 with the silicon of the optical waveguide 106. For example, one effect of such intermixing would be to reduce the responsivity of the Ge active region 132 and consequently the formed photodetector 102.

The optical signal traversing within the optical waveguide structure 106 may be received by the active region 132 through the silicon nitride layer 136. Although any received optical signal received by the active region 132 is attenuated by layer 136, based on the thickness of this layer 136, the attenuation is low enough in order to not impede the operation and sensitivity of the photodetector 102.

Figure 1F:
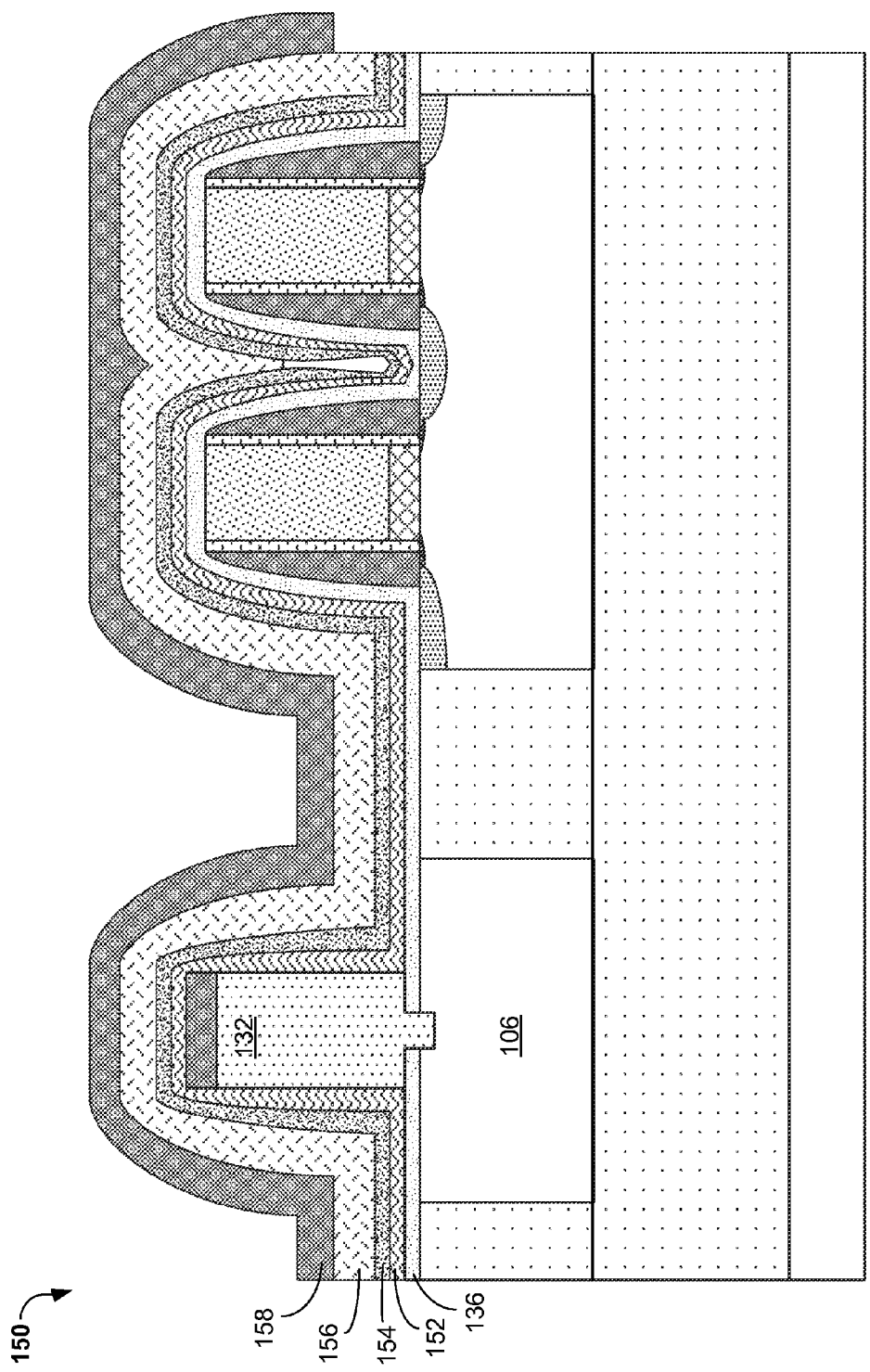

Referring to FIG. 1F, integrated photonic device structure 150 includes the formation of encapsulating layers 152-158 within structure 140 of FIG. 1E. As illustrated, a silicon nitride layer 152 may be deposited over silicon nitride layer 136 using a low stress plasma enhanced chemical vapor deposition (PECVD) process. The silicon nitride layer 152 may include a thickness in the range of about 100-1000 Å. Preferably, silicon nitride layer 152 may have a thickness of approximately 500 Å and act as a buffer layer for subsequently deposited layers such as, for example, oxide layer 154 and silicon nitride layer 156.

An oxide layer 154 may then be deposited over silicon nitride layer 152 using either a PECVD or a low temperature thermally activated CVD deposition process. The oxide layer 154 may have a thickness in the range of about 100-2000 Å. Preferably, oxide layer 154 may have a thickness of approximately 500 Å and mitigates germanium expansion during the crystallization melt process of the Ge active region 132. A silicon nitride layer 156 may be deposited over oxide layer 154 using a PECVD deposition process. The silicon nitride layer 156 may have a thickness in the range of about 500-3000 Å. Preferably, silicon nitride layer 156 may have a thickness of approximately 1000 Å and mitigates germanium expansion during the crystallization melt process.

Another silicon nitride layer 158 may optionally be deposited over silicon nitride layer 156 using a RTCVD deposition process. The silicon nitride layer 158 may have a thickness in the range of about 500-2000 Å. Preferably, silicon nitride layer 158 may have a thickness of approximately 1000 Å and acts as a sealant of seams and controller of PECVD morphology.

Figure 1G:
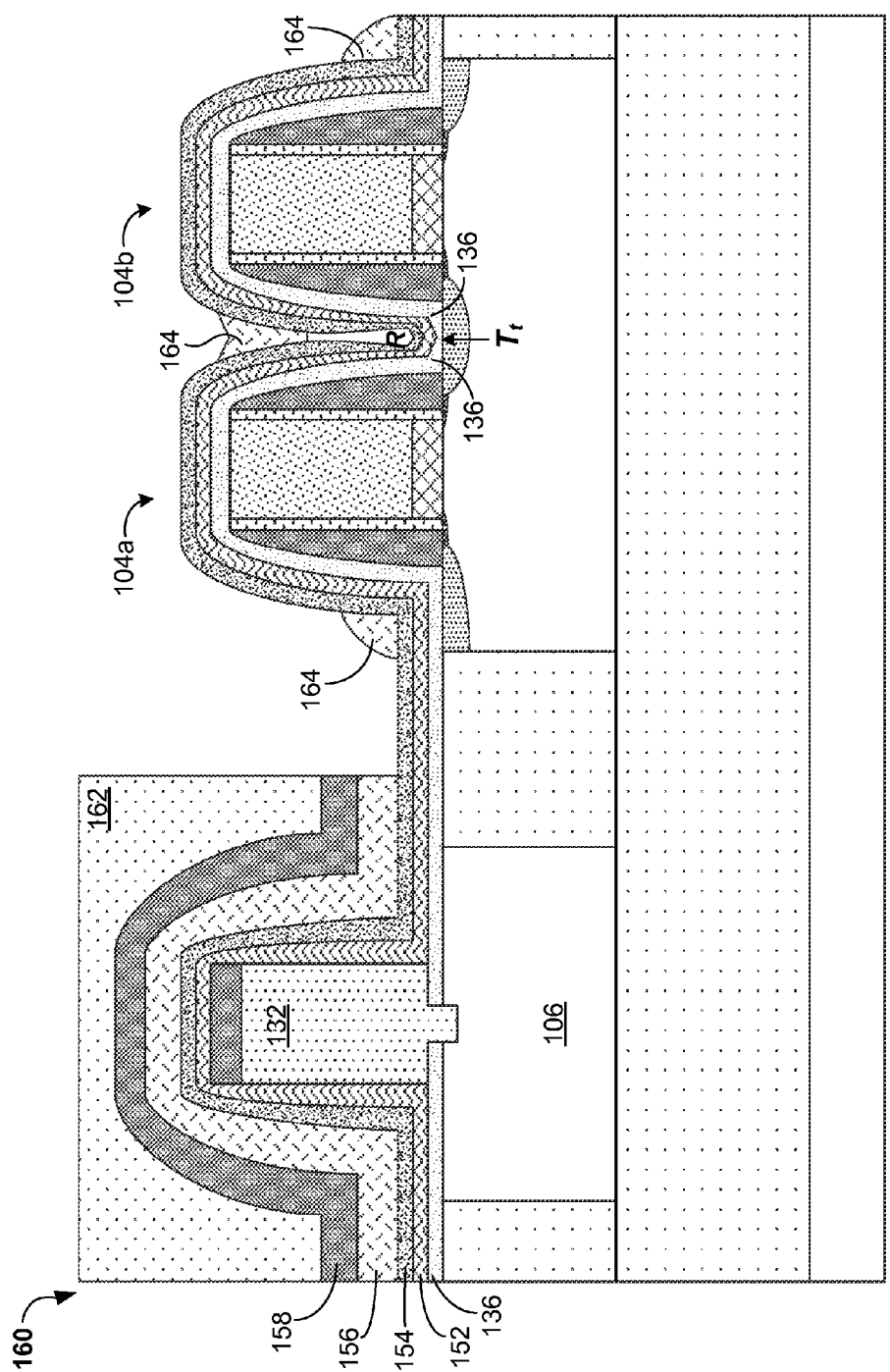

Referring to integrated photonic device structure 160 of FIG. 1G, the formed encapsulating layers 152-158 of structure 150 are partially etched from the FET transistors 104a, 104b during a first etch process (e.g., a reactive ion etch). During the first etch process, silicon nitride layers 156 and 158 are etched down to oxide layer 154, while the encapsulating layers 152-158 covering the Ge active region 132 remain protected by patterned photoresist layer 162. As depicted, residual silicon nitride 164 from the silicon nitride layer 152 may remain.

Figure 1H:
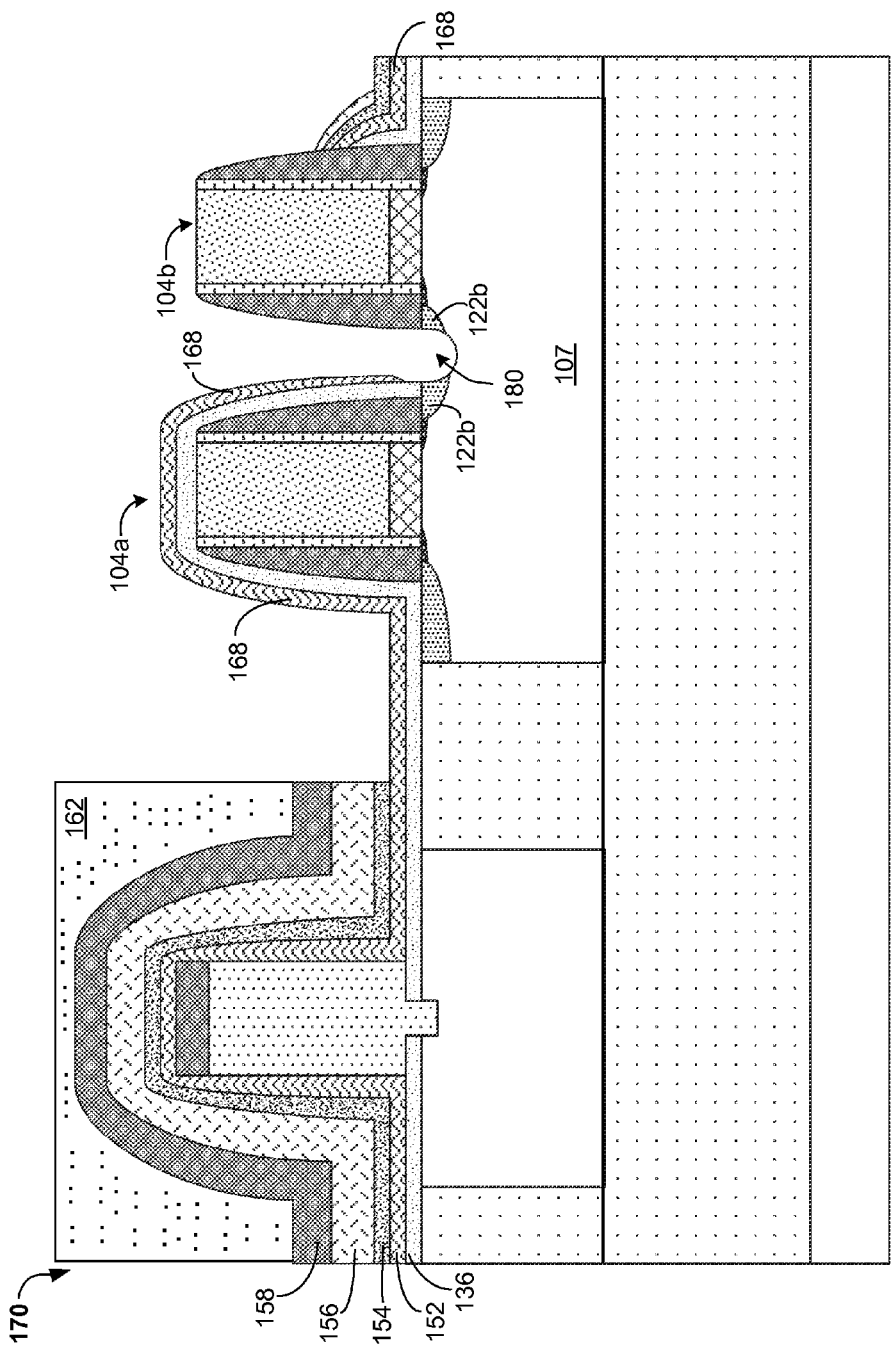

Referring to integrated photonic device structure 170 of FIG. 1H, the remaining encapsulating layers 152, 154 of structure 160 are partially etched from the FET transistors 104a, 104b during a second etch process (e.g., a reactive ion etch). During the second etch process, silicon nitride layers 152 and 154 are etched, while the encapsulating layers 152-158 covering the Ge active region 132 still remain protected by patterned photoresist layer 162. As depicted, residual silicon nitride 168 from the silicon nitride layer 156 may remain. Also, an over etched region 180 within the S/D region 122b of the FET transistors 104a, 104b may ultimately be created as a result of the thinning of silicon nitride 136 (FIG. 1G), as defined by $T_t$ (FIG. 1G), within the narrowly spaced region R (FIG. 1G) located between FET transistors 104a and 104b (FIG. 1G). Such over etching may, for example, affect the S/D doping of the S/D region 122b, which in turn may cause an undesirable increase in FET device leakage current.

FIGS. 2A-2L illustrate vertical cross-sectional views of an integrated photonic semiconductor device structure, whereby Ge layer deposition conformity is preserved over the CMOS devices according to a first embodiment. Although, the above described embodiment shows a gap or void (see FIG. 1D) based on the poor conformity of the deposited Ge layer using a PVD process, the following integration process maintains the conformity of the deposited Ge layer while using such less costly PVD processes (e.g., sputter PVD).

Figure 2A:
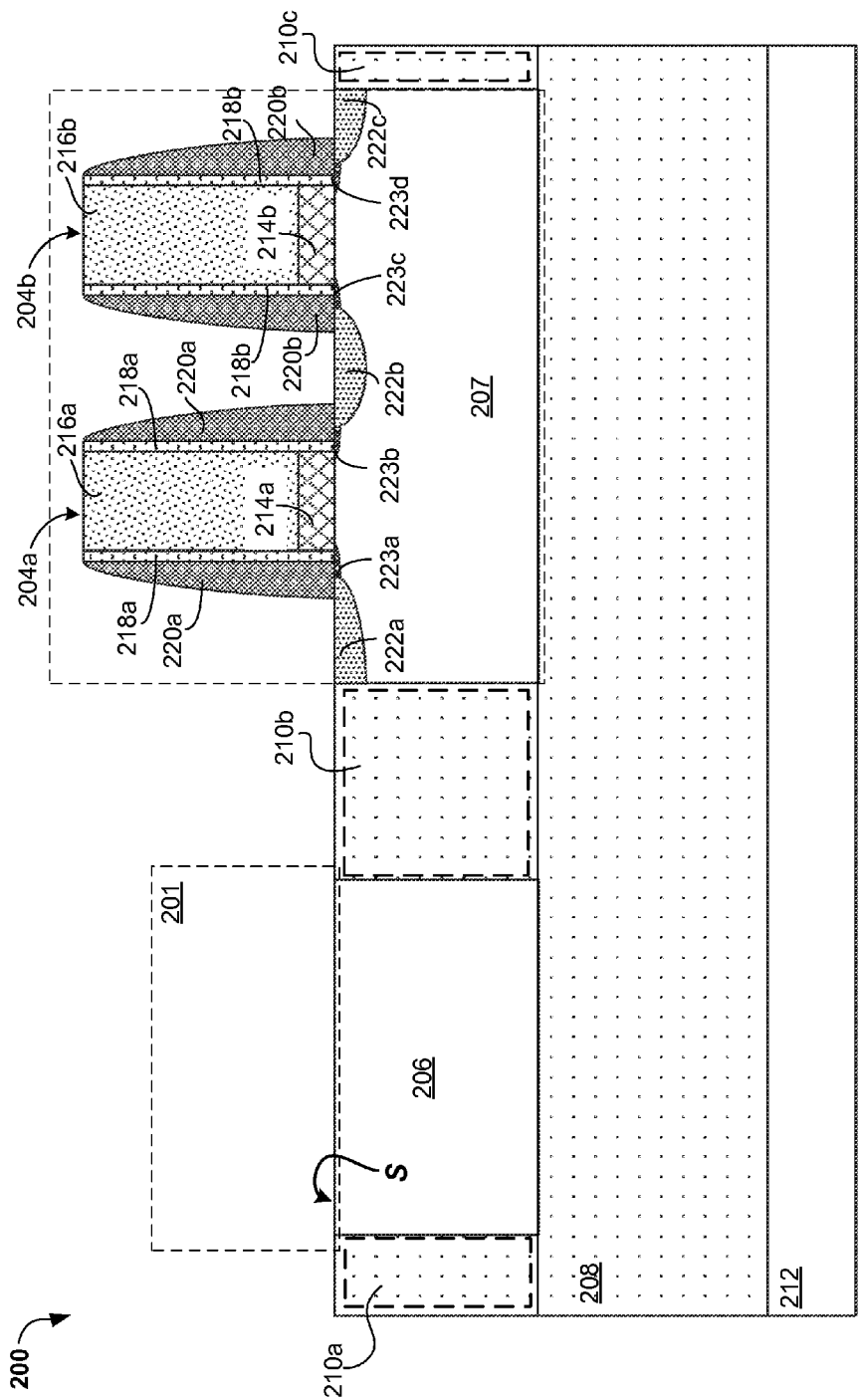

Referring to FIG. 2A, an integrated photonic semiconductor structure 200 is illustrated. The integrated photonic semiconductor structure 200 may be identical or similar to that of integrated photonic semiconductor structure 100. Thus, integrated photonic semiconductor structure 200 may include a photonic device formation region 201 for fabricating, for example, a Germanium (Ge) photodetector (FIG. 2G: photodetector 202) and adjacent CMOS devices such as adjacent FET transistors 204a and 204b. The integrated photonic semiconductor structure 200 may further include an optical waveguide structure 206, a buried oxide (BOX) region 208, shallow trench isolation (STI) regions 210a-210c, and a silicon substrate 212. The BOX region 208 is located over the silicon substrate 212. The optical waveguide structure 206 may be formed within a silicon-on-insulator (SOI) layer (not shown) of structure 200, whereby the STI regions 210a-210b and BOX region 208 surrounding the waveguide 206 facilitate optical confinement (i.e., cladding) and low-loss waveguiding. In addition, STI region 210b may provide electrical isolation between a subsequently formed Germanium (Ge) photodetector within region 201 and the FET transistors 204a and 204b.

As depicted, CMOS FET transistor 204a may include a gate dielectric 214a, a polysilicon gate 216a, spacer oxide regions 218a, spacer nitride regions 220a, source/drain (S/D) regions 222a, 222b, and halo and extension implants 223a and 223b. Similarly, CMOS FET transistor 204b may include a gate dielectric 214b, a polysilicon gate 216b, spacer oxide regions 218b, spacer nitride regions 220b, source/drain (S/D) regions 222b, 222c, and halo and extension implants 223c and 223d. Well region 207, the S/D regions 222a-222c, and the halo and extension implants 223a-223d of FET transistors 204a and 204b are also formed within the silicon-on-insulator (SOI) layer (not shown). As depicted in the exemplary embodiment, S/D region 222b is shared between FET transistors 204a and 204b.

Figure 2B:
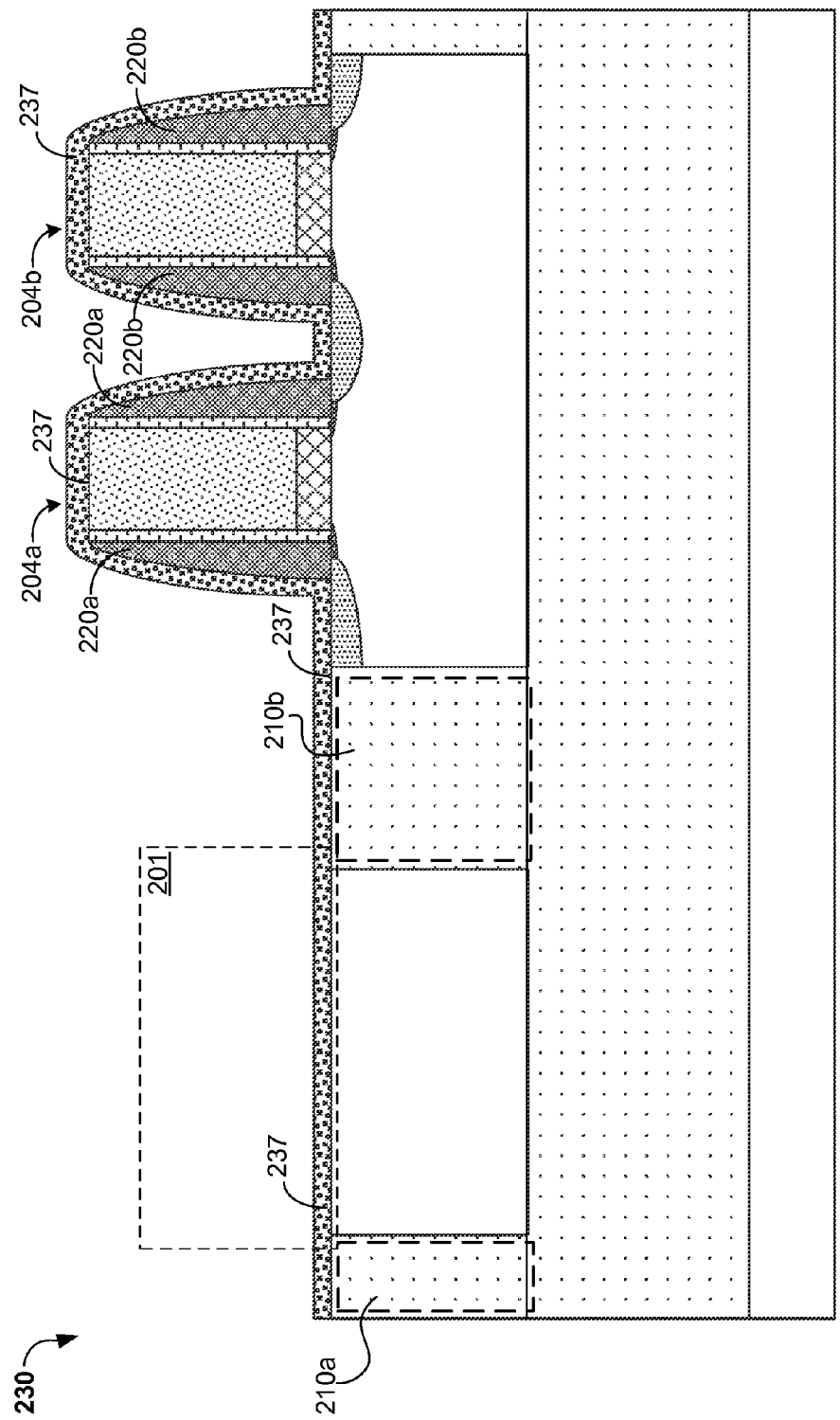

Referring to FIG. 2B, the fabrication of integrated photonic device structure 230 includes the deposition of a silicon nitride layer 237 of approximately 1000 Å or less over the surface S (FIG. 2A) of the photonic device formation region 201, the STI regions 210a-210c, and the CMOS FET transistors 204a, 204b of integrated photonic device structure 200. The silicon nitride layer 237 may be used to protect the spacer nitride regions 220a, 220b during subsequent etching and silicide processes.

Figure 2C:
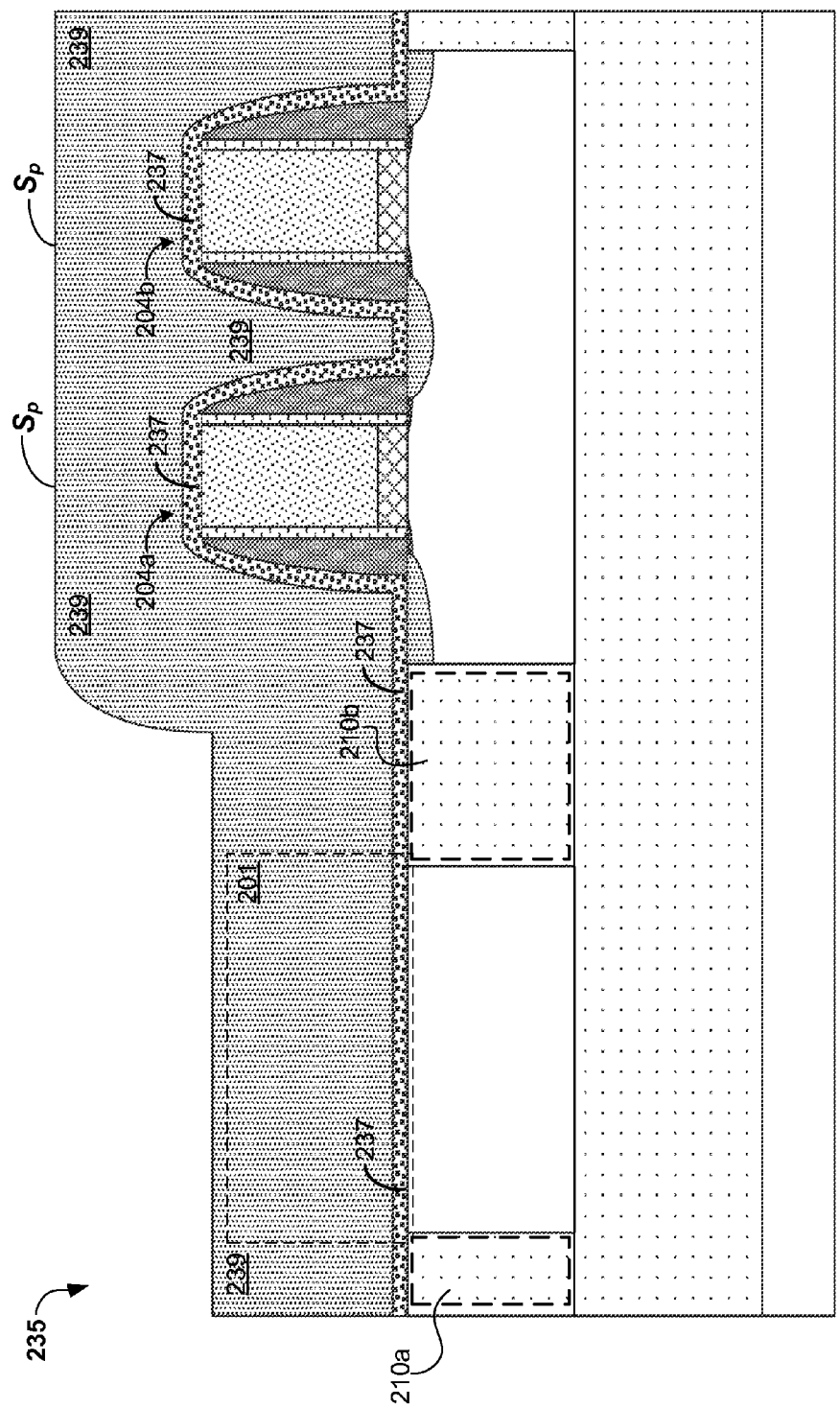

Referring to FIG. 2C, fabrication of integrated photonic device structure 235 includes a thermal CVD deposition of an oxide layer (e.g., low temperature silicon dioxide) 239 having a thickness of approximately 500-4000 Å over the silicon nitride layer 237 of integrated photonic device structure 230. As depicted, the deposited thick oxide layer (e.g., silicon dioxide) 239 creates a substantially planar surface $S_p$ over the relatively tightly pitched (e.g.,0.14 μm pitch) CMOS FET transistors 204a, 204b. The deposited thick oxide layer, therefore, provides a protective layer for the underlying FET transistors 204a, 204b.

Figure 2D:
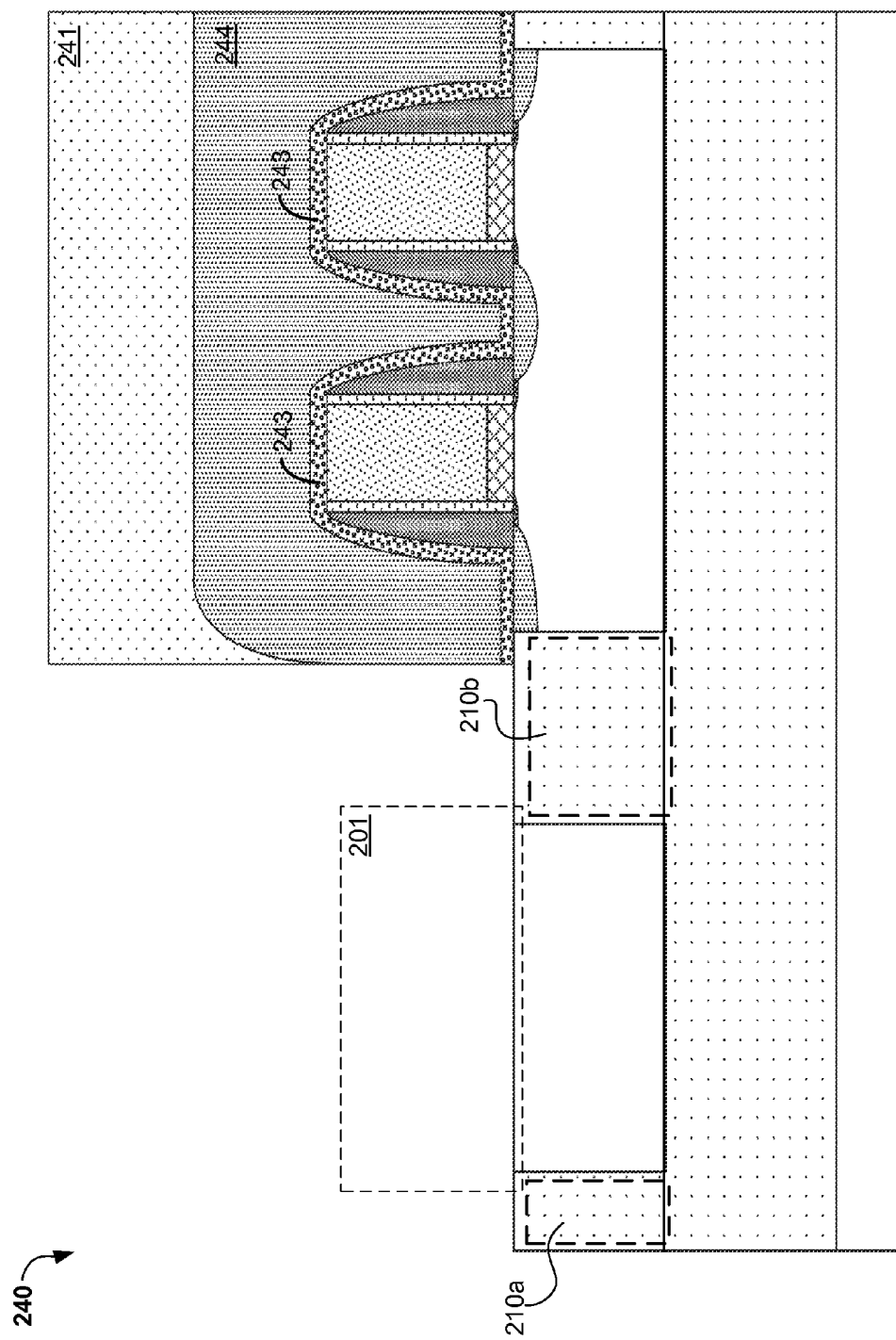

Referring to FIG. 2D, fabrication of integrated photonic device structure 240 includes the etching (e.g., RIE) of a portion of the deposited oxide layer 239 (FIG. 2C) and silicon nitride layer 237 (FIG. 2C) from the photonic device formation region 201 and the STI regions 210a, 210b of integrated photonic device structure 235 (FIG. 2C). As depicted, based on the patterning of a layer of deposited photoresist (not shown), photoresist region 241 protects underlying oxide region or layer 244 and silicon nitride layer 243, whereby the remaining oxide layer (FIG. 2C) and silicon nitride layer (FIG. 2C) covering the photonic device formation region 201 and STI regions 210a, 210b is etched.

Figure 2E:
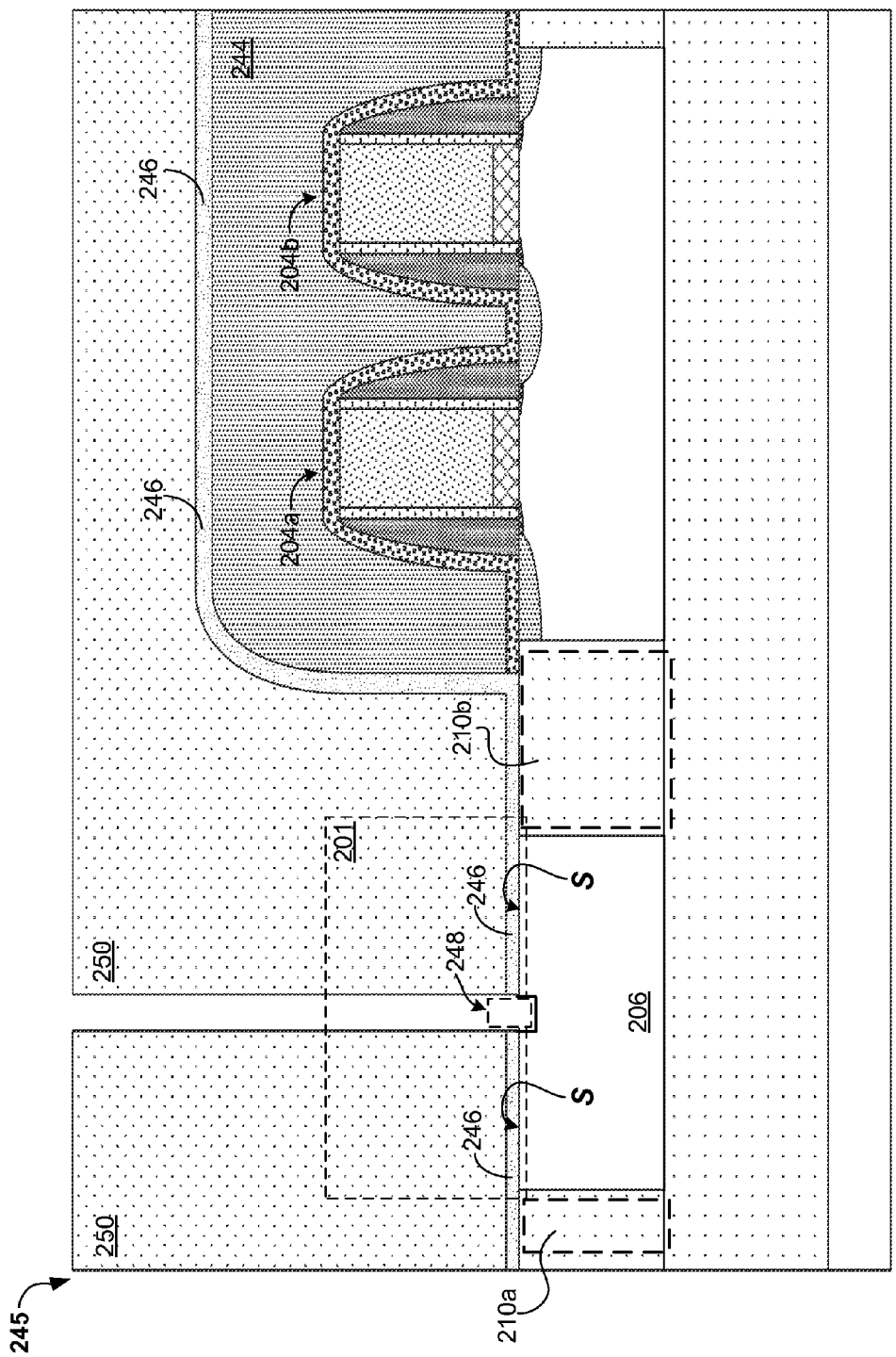

Referring to FIG. 2E, fabrication of integrated photonic device structure 245 includes the formation of a Ge crystallization window region within structure 240 of FIG. 2D. Prior to creating the crystallization window, a silicon nitride layer 246 of approximately 500 Å or less may be formed over the surface S of the photonic device formation region 201, the STI regions 210a, 210b, and the protective oxide layer 244. As depicted, an opening 248 may be formed within the silicon nitride layer 246 and a surface portion of the optical waveguide 206 by photolithographically patterned resist layer 250. During the subsequent formation of a Ge active region 252 (see FIG. 2G), a portion of the Ge active region fills opening 248 in order for the Ge active region 252 to establish contact with the silicon material of optical waveguide 206. Such contact may enable the Ge active region 252 to utilize the silicon material of optical waveguide 206 as a seed layer during the crystallization process of the Ge active region at a later process stage.

Figure 2F:
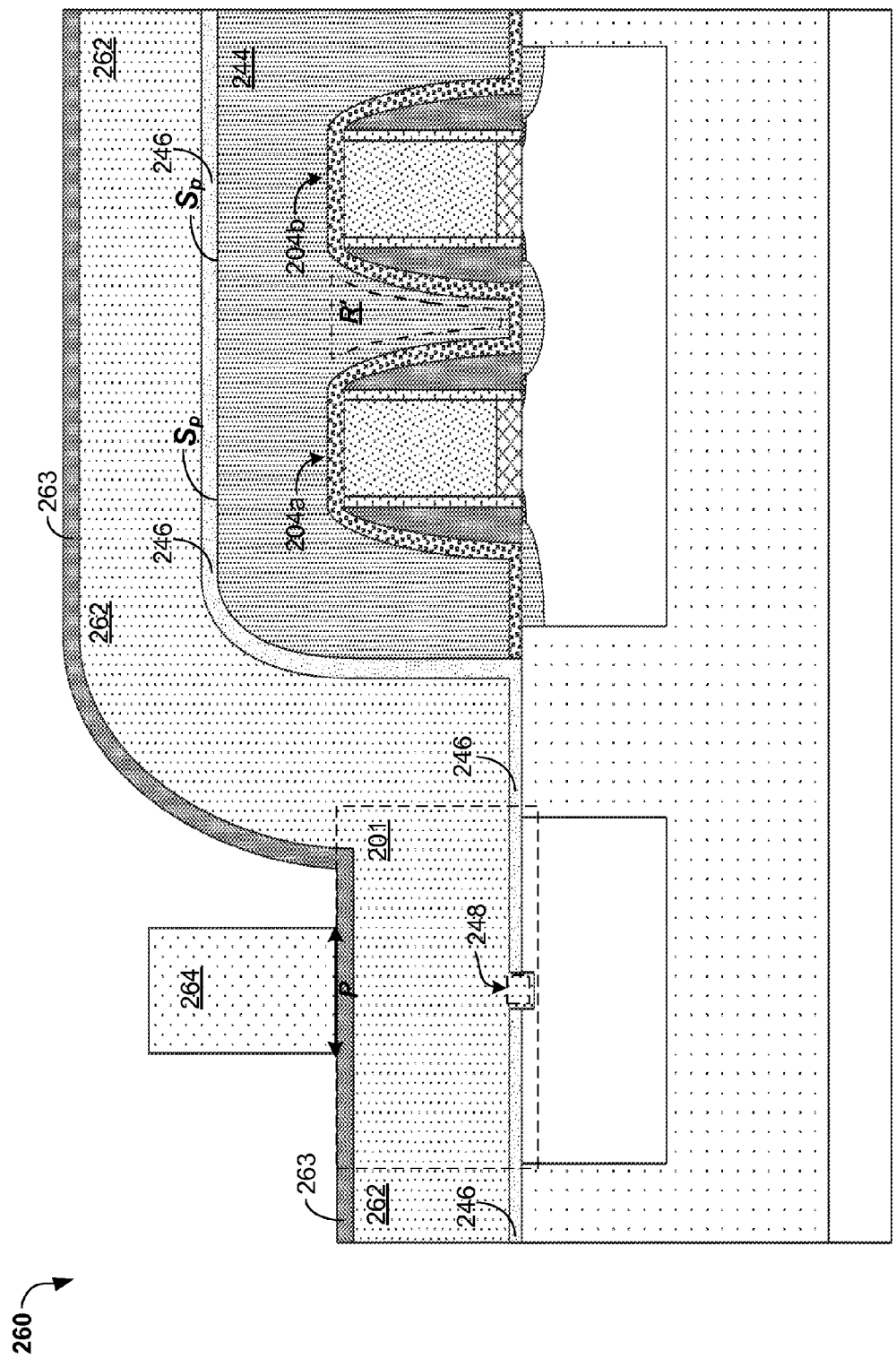

As shown in FIG. 2F, fabrication of integrated photonic device structure 260 includes the formation of a deposited Ge layer over structure 245 of FIG. 2E. In the illustrated embodiment, upon removal of the patterned resist layer 250 (FIG. 2E), a PVD deposition method may be used to deposit a layer of germanium (Ge) 262 both within opening 248 and over silicon nitride layer 246. A silicon nitride ($Si_3N_4$) hard mask layer 263 is also formed over the top surface of the Ge layer 262. A photolithographically patterned resist layer 264 is then formed on the hard mask layer 263 over portion P of the photonic device formation region 201. Despite utilizing a PVD deposition process, in contrast to the fabricated structure 135' of FIG. 1D, the Ge layer 262 is deposited with good conformity, such that no gaps or voids are created. This occurs as a result of growing the Ge layer 262 over the substantially planar surface of the protective oxide region 244 rather than within the high aspect ratio region R' located between FET transistors 204a and 204b. For example, as previously indicated, the pitch between the gates of the FET transistors 204a, 204b may be in the region of about 0.14 µm or less. Moreover, as transistor scaling and gate pitch reduces with technological advancement, further increases in aspect ratio may be observed. Deposition of the layer of germanium (Ge) 262 over the oxide region 244 negates such conformity issues, particularly conformity associated with adequately filling high aspect ratio areas located between tightly pitched devices.

Figure 2G:
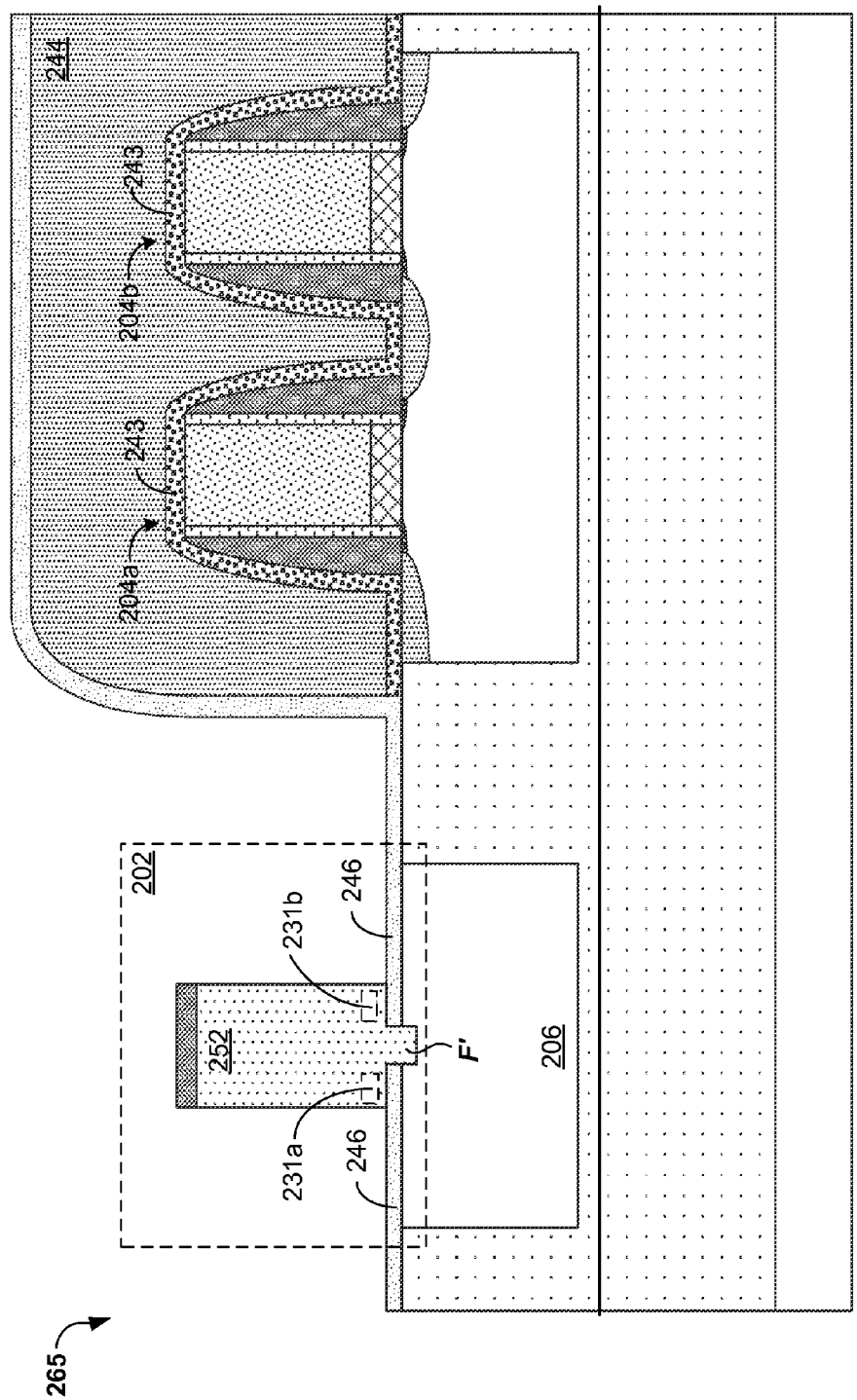

Referring to FIG. 2G, the fabrication of integrated photonic device structure 265 includes the formation of Ge active region 252 by etching the Ge layer 262 (FIG. 2F) of structure 260 (FIG. 2F). The region of the Ge layer 262 (FIG. 2F) located under photo resist layer 264 (FIG. 2F) is protected to form Ge active region 252, while the remaining Ge material is etched away.

As illustrated, portion F' of the bottom portion of the Ge active region 252 may act as a seed layer by contacting the silicon material of the optical waveguide 206. The remaining regions 231a, 231b of the bottom portion of Ge active region 252 may be isolated from the silicon optical waveguide 206 by the silicon nitride layer 246. The isolation between the remaining portions 231a, 231b of the Ge active region 252 and the silicon optical waveguide 206 may facilitate the avoidance of the intermixing of germanium from the Ge active region 252 with the silicon of the optical waveguide 206. As previously indicated, one effect of such intermixing may be to reduce the responsivity of the Ge active region 252 and consequently the formed photodetector 202.

The optical signal traversing within the optical waveguide structure 206 may be received by the active region 252 through the silicon nitride layer 246. Although any received optical signal received by the active region 252 is attenuated by layer 246, based on the thickness of this layer 246, the attenuation is low enough in order to not impede the operation and sensitivity of the photodetector 202.

Figure 2H:
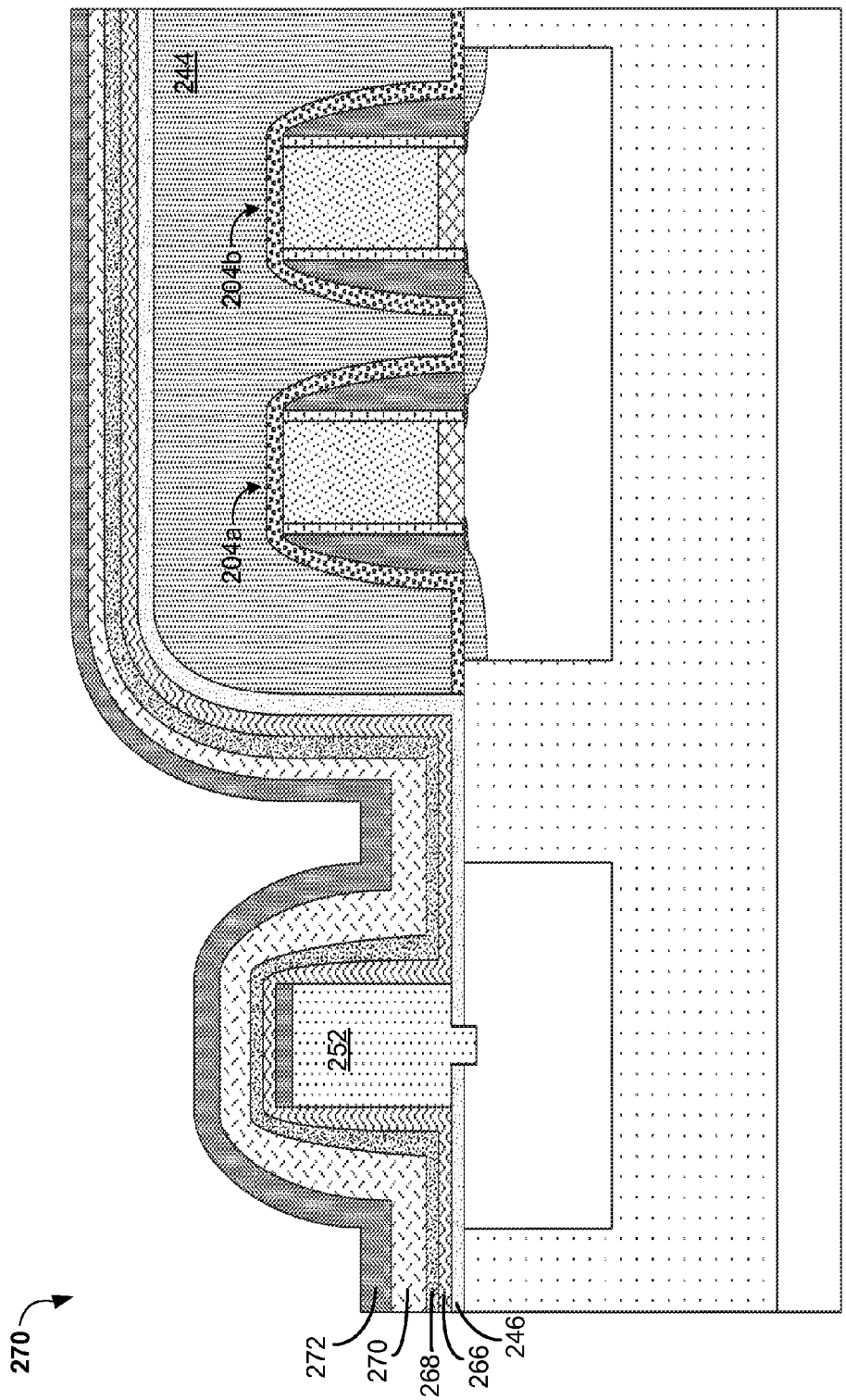
Figure 21:
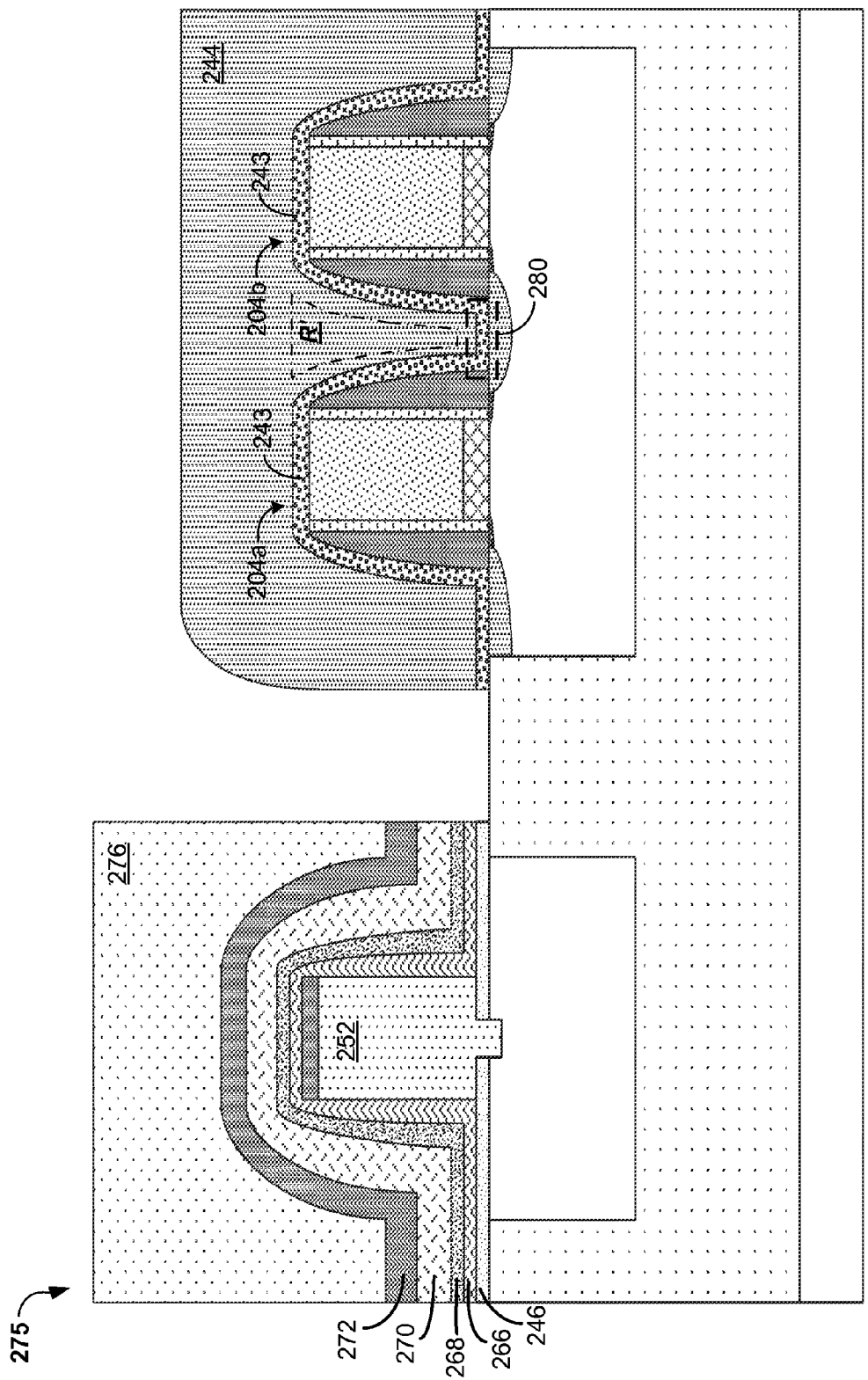

Referring to FIG. 2H, fabricating integrated photonic device structure 270 includes the formation of encapsulating layers 266-272 within structure 265 of FIG. 2G. As illustrated, a silicon nitride layer 266 may be deposited over silicon nitride layer 246 using a low stress plasma enhanced chemical vapor deposition (PECVD) process. The silicon nitride layer 266 may include a thickness in the range of about 100-1000 Å. Preferably, silicon nitride layer 266 may have a thickness of approximately 500 Å and act as a buffer layer for subsequently deposited layers such as, for example, oxide layer 268 and silicon nitride layer 270.

An oxide layer 268 may then be deposited over silicon nitride layer 266 using either a PECVD or a low temperature thermally activated CVD deposition process. The oxide layer 268 may have a thickness in the range of about 100-2000 Å. Preferably, oxide layer 268 may have a thickness of approximately 500 Å and mitigates germanium expansion during the crystallization melt process of the Ge active region 252. A silicon nitride layer 270 may be deposited over oxide layer 268 using a PECVD deposition process. The silicon nitride layer 270 may have a thickness in the range of about 500-3000 Å. Preferably, silicon nitride layer 270 may have a thickness of approximately 1000 Å and mitigates germanium expansion during the crystallization melt process.

Another silicon nitride layer 272 may optionally be deposited over silicon nitride layer 270 using a RTCVD deposition process. The silicon nitride layer 272 may have a thickness in the range of about 500-2000 Å. Preferably, silicon nitride layer 272 may have a thickness of approximately 1000 Å and acts as a sealant of seams and controller of PECVD morphology.

Referring to integrated photonic device structure 275 of FIG. 2I, the formed encapsulating layers 266-272 (FIG. 2H) and silicon nitride layer 246 (FIG. 2H) of structure 270 (FIG. 2H) are etched from over the protective oxide region 244 (FIG. 2H) covering the FET transistors 204a, 204b (FIG. 2H). As depicted in FIG. 2I, the encapsulating layers 266-272 covering the Ge active region 252 remain protected by patterned photoresist layer 276, while the remaining portion of the encapsulating layers 266-272 and the silicon nitride layer 246 are removed. As shown, since the oxide region 244 includes no gaps or voids at location R' between the FET transistors 204a, 204b, the subsequent etching of the encapsulating layers 246-272 does not cause a thinning of the silicon nitride layer 243 covering and protecting the FET transistors 204a, 204b at region 280.

Figure 2J:
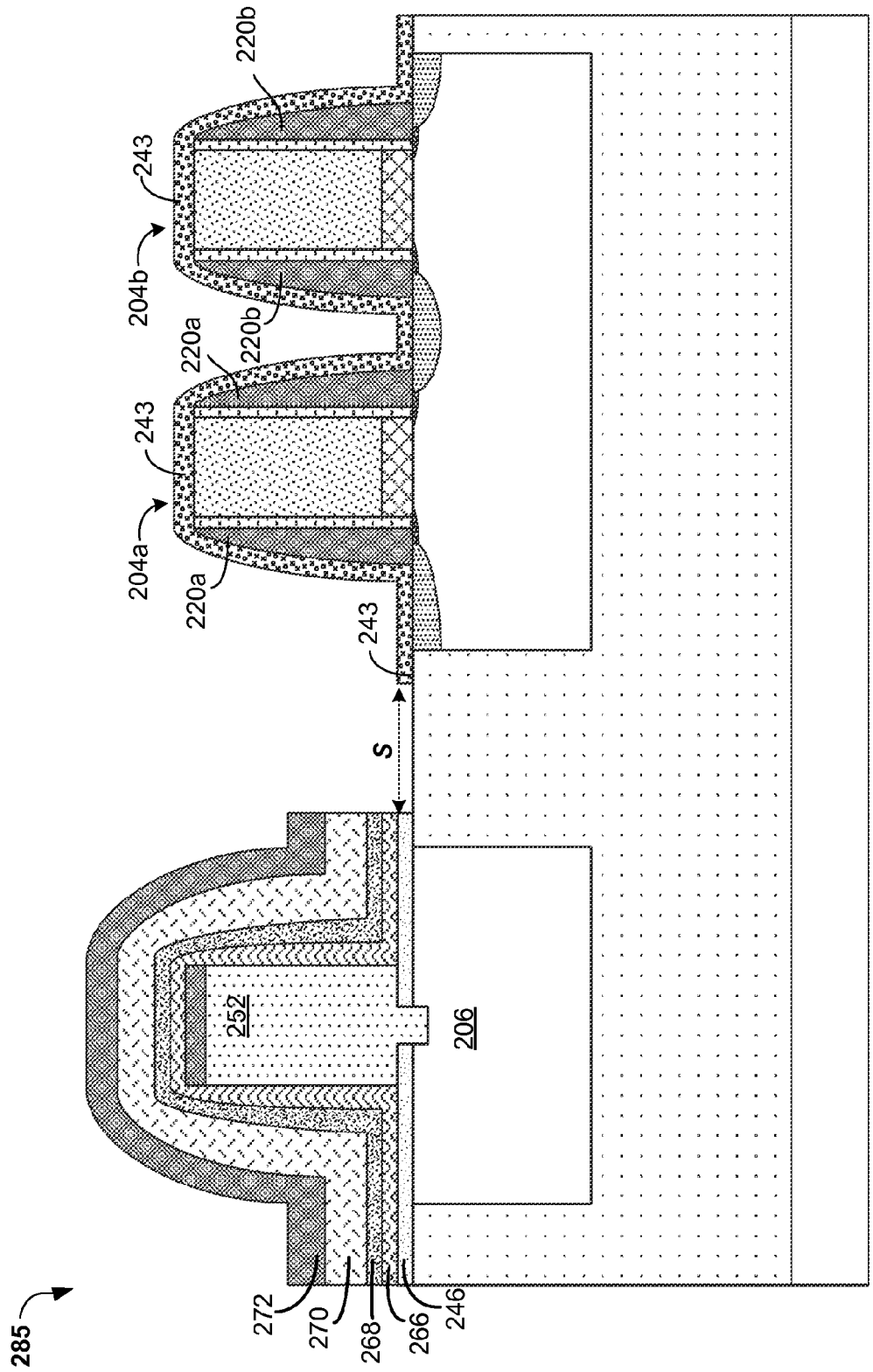

Referring to integrated photonic device structure 285 of FIG. 2J, the formed oxide region or oxide layer 244 (FIG. 2I) of structure 275 (FIG. 2I) is then etched from over the silicon nitride layer 243 (FIG. 2I) of the FET transistors 204a, 204b (FIG. 2I). As depicted in FIG. 2J, the processes of FIGS. 2A-2J separate, as defined by S, the silicon nitride layer 243 deposited over the FET transistors 204a, 204b from the silicon nitride layer 246 buffered between the optical waveguide 206 and the bottom portion of Ge active region 252. Silicon nitride layer 246 may be optimized (e.g., thickness) for facilitating receiving optical signals from the waveguide 206. The silicon nitride layer 243 on the other hand may be optimized to protect the spacer regions of the FET transistors 204a, 204b, as well as providing other properties (e.g., tensile or compressive stress characteristics) that may enhance the electrical properties of the FET transistors 204a, 204b. Thus, separating the nitride layers 243, 246 may enable the application of independent control over the properties of these layers 243, 246.

Figure 2K:
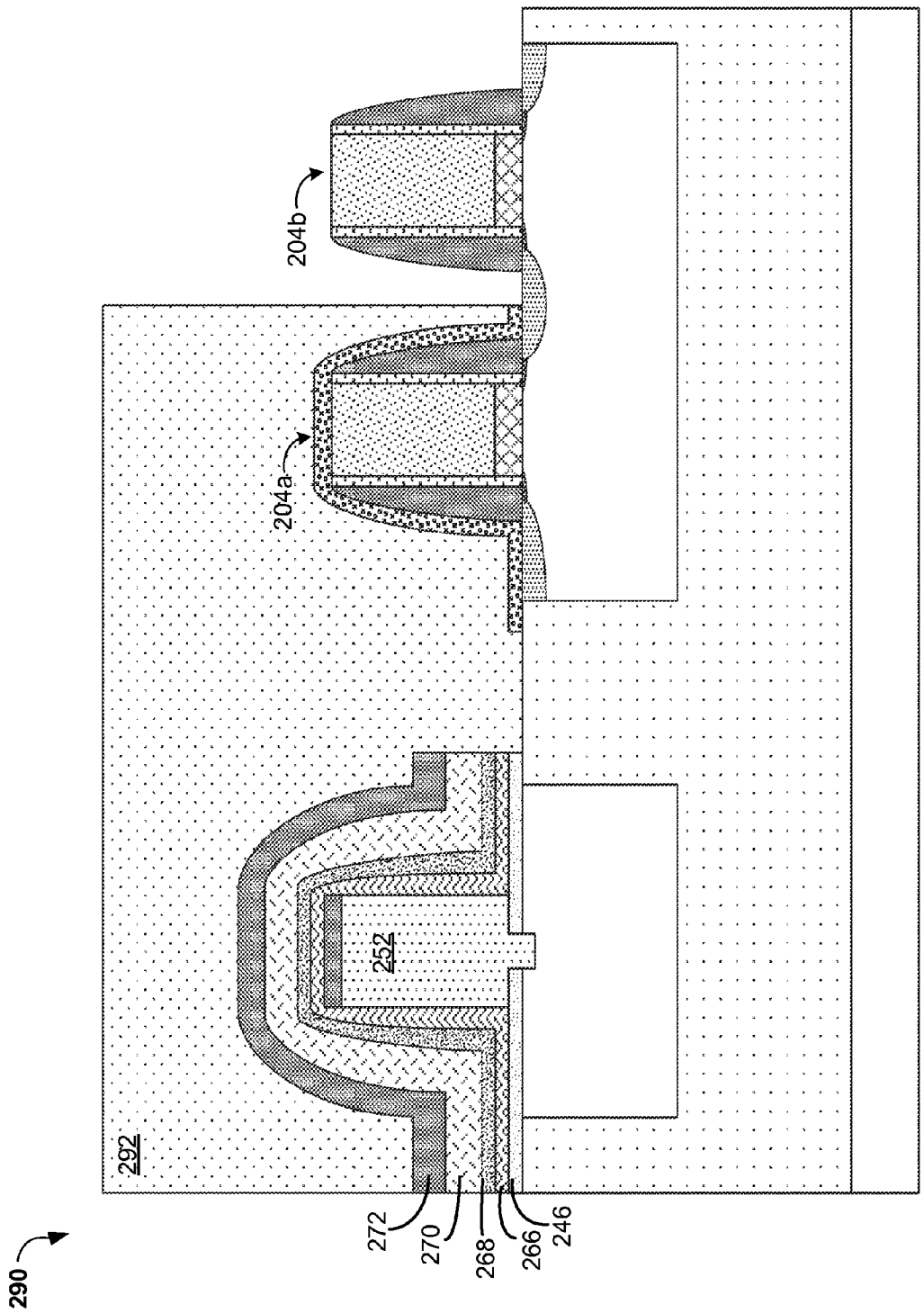
Figure 2L:
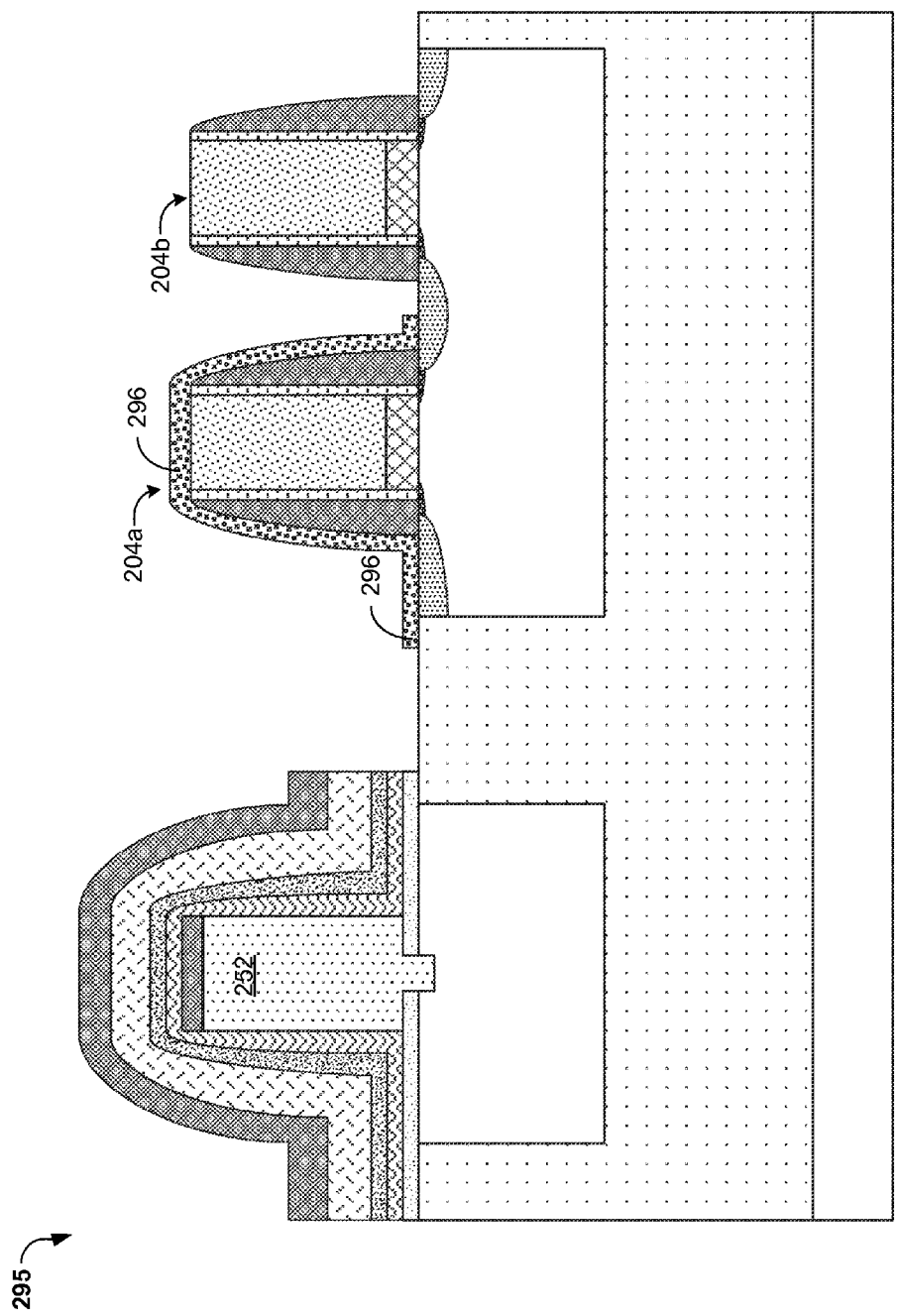

Integrated photonic device structures 290 and 295 that are depicted in FIGS. 2K and 2L, respectively, illustrate an optional etching process for facilitating a silicide process for integrated photonic device structure 285 (FIG. 2J). Referring to FIG. 2K, by depositing a patterned photoresist layer 292 over both FET transistor 204a and encapsulating layers 266-272 of the Ge active region 252, the silicon nitride layer 243 (FIG. 2J) covering FET transistor 204b is etched away in order to accommodate the siliciding process. As illustrated in FIG. 2L, the photoresist layer 292 is removed and the remaining portion 296 of silicon nitride layer 243 (FIG. 2J) protects FET transistor 204a during the siliciding (not shown) of FET transistor 204b.

It may be appreciated that according to an alternative embodiment, FET transistors 204a, 204b (FIG. 2A) may not be fabricated over an active region such as well region 207 (FIG. 2A). For example, FET transistors 204a, 204b (FIG. 2A) may be fabricated over an STI region. In such an embodiment, the degradation, as depicted in FIG. 1H, of the region located between the FET transistors may be more prominently impacted by the etch process (e.g., gas, pressure, temp., RF plasma, etc.) since the insulation material of the STI region is more susceptible to the etch process than silicon (e.g., FIG. 1H: well region 107). For example, referring to FIG. 1H, if the FET transistors 104a, 104b are not located over the well region 107, and instead, are fabricated over an STI region (not shown), the etched region 180 would be larger to the extent that some of the STI material under the gate region of the FET transistors 104a, 104b may be removed. In this case, one or both of the FET transistors 104a, 104b may lift-off from the STI surface (not shown).

FIGS. 3A-3J illustrate vertical cross-sectional views of an integrated photonic semiconductor device structure, whereby Ge layer deposition conformity is preserved over the CMOS devices according to a first embodiment. Although, the above described embodiment shows a gap or void (see FIG. 1D) based on the poor conformity of the deposited Ge layer using a PVD process, the following integration process also maintains the conformity of the deposited GE layer while using such less costly PVD processes (e.g., sputter PVD).

Figure 3A:
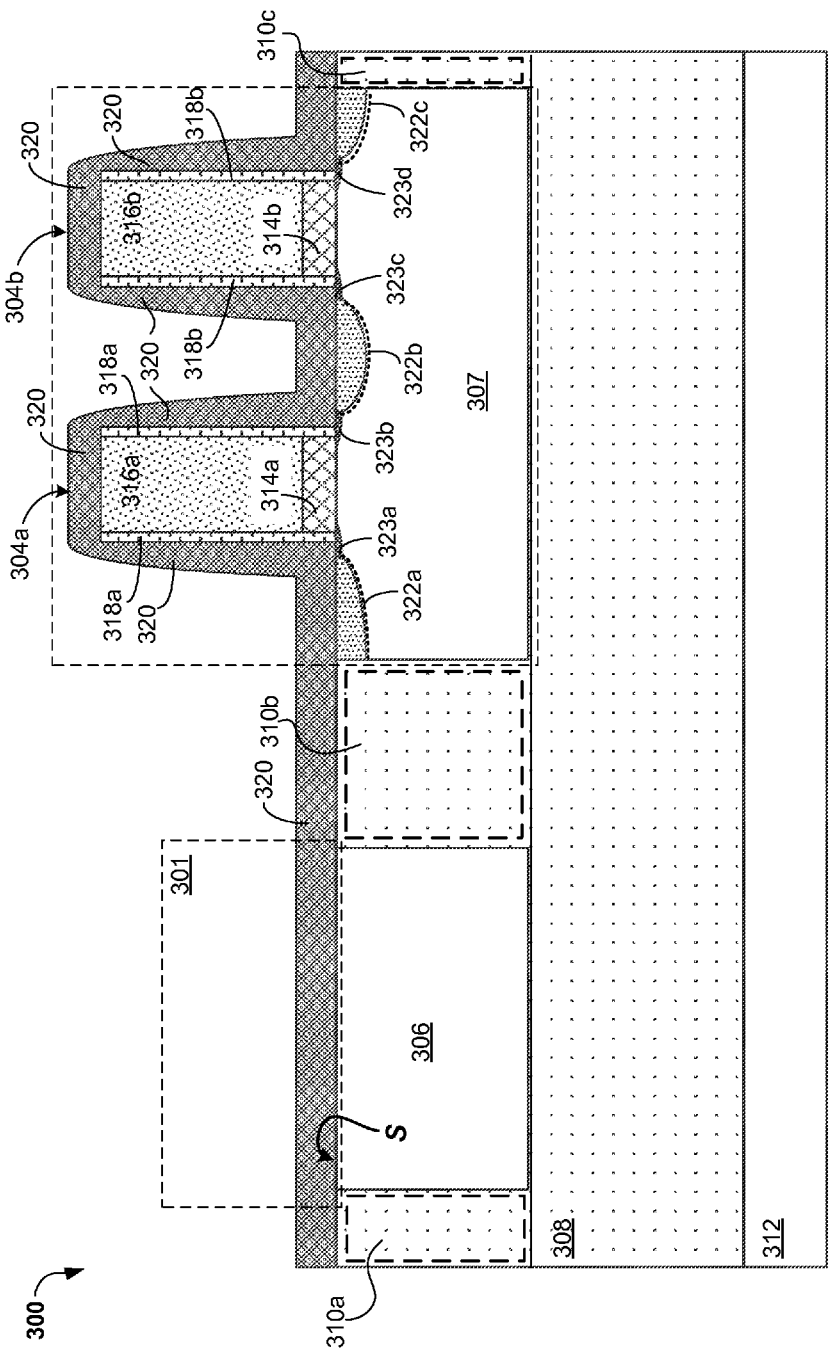
FIGS. 3A-3J are vertical cross-sectional views of an integrated photonic semiconductor device structure illustrating the preservation of Ge layer deposition conformity over the CMOS devices according to a second embodiment.

Referring to FIG. 3A, an integrated photonic semiconductor structure 300 is illustrated. Integrated photonic semiconductor structure 300 may include a photonic device formation region 301 for fabricating, for example, a Germanium (Ge) photodetector (FIG. 3F: photodetector 302) and adjacent CMOS devices such as adjacent FET transistors 304a and 304b. The integrated photonic semiconductor structure 300 may further include an optical waveguide structure 306, a buried oxide (BOX) region 308, shallow trench isolation (STI) regions 310a-310c, and a silicon substrate 312. The BOX region 308 is located over the silicon substrate 312. The optical waveguide structure 306 may be formed within a silicon-on-insulator (SOI) layer (not shown) of structure 300, whereby the STI regions 310a-310b and BOX region 308 surrounding the waveguide 306 facilitate optical confinement (i.e., cladding) and low-loss waveguiding. In addition, STI region 310b may provide electrical isolation between a subsequently formed Germanium (Ge) photodetector within region 301 and the FET transistors 304a, 304b.

As depicted, CMOS FET transistor 304a may include a gate dielectric 314a, a polysilicon gate 316a, spacer oxide regions 318a, source/drain (S/D) formation regions 322a, 322b, and halo and extension implants 323a and 323b. Similarly, CMOS FET transistor 304b may include a gate dielectric 314b, a polysilicon gate 316b, spacer oxide regions 318b, source/drain (S/D) formation regions 322b, 322c, and halo and extension implants 323c and 323d. In the depicted embodiments of FIGS. 3A-3H, the source/drain (S/D) formation regions, as defined by dotted regions 322a-322c, are indicative of the region where the S/D regions are ultimately formed during subsequent process steps. Well region 307, the S/D formation regions 322a-322c, and the halo and extension implants 323a-323d of FET transistors 304a and 304b are also formed within the silicon-on-insulator (SOI) layer (not shown). As depicted in the exemplary embodiment, S/D formation region 322b is shared between FET transistors 304a and 304b. A silicon nitride layer 320 is deposited over region 301, the STI regions 310a-310c, and the FET transistors 304a, 304b. The silicon nitride layer 320 may be used to form nitride spacers for the FET transistors 304a, 304b during subsequent processing steps.

Since the formed nitride spacers define the source/drain regions, the source/drain regions are not formed until after the nitride layer 320 is etched (FIG. 3I) to form the spacers. After the nitride spacers are formed (FIG. 3I), then the S/D implant process occurs to form the S/D regions 322a'-322c' (FIG. 3I) at source/drain (S/D) formation regions 322a-322c. Thus, following the removal of encapsulation films and protective oxide layer in FIG. 3H, the photodetector regions are masked with resist and the nitride spacer layer 343 (FIG. 3H) is etched, as shown in FIG. 3I. S/D dopants are then implanted into S/D regions of the FETs and the resist mask is subsequently removed. This applies not only to S/D implants but to other implants that occur after the nitride spacers are formed, including, for example, photonic modulator implants and CMOS resistor implants.

Figure 3B:
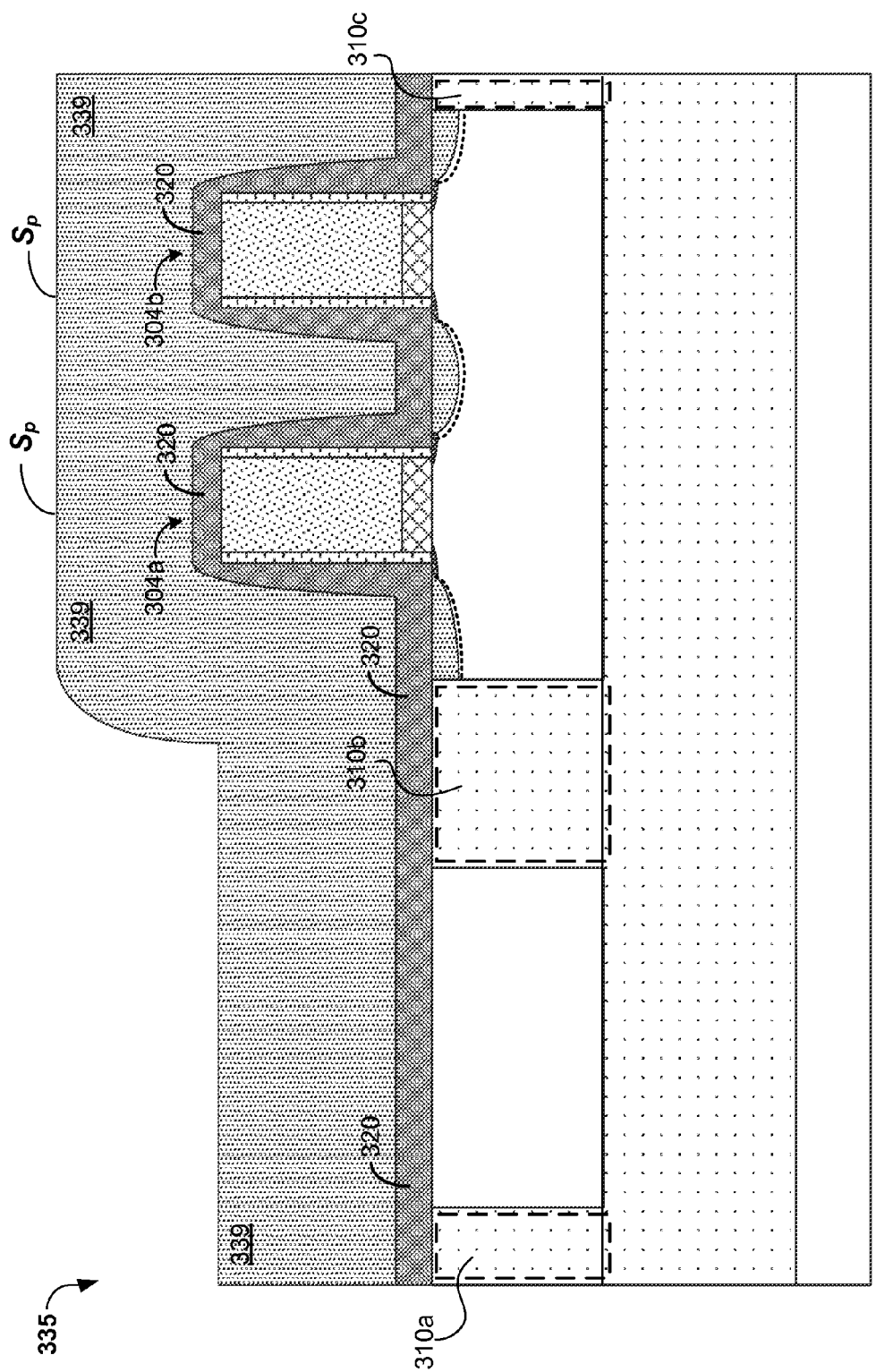

Referring to FIG. 3B, fabrication of integrated photonic device structure 335 includes a thermal CVD deposition of an oxide layer (e.g., low temperature silicon dioxide) 339 having a thickness of approximately 500-4000 Å over the silicon nitride layer 320 of integrated photonic device structure 300. As depicted, the deposited thick oxide layer (e.g., silicon dioxide) 339 creates a substantially planar surface $S_p$ over the relatively tightly pitched (e.g., 0.14 μm pitch) CMOS FET transistors 304a, 304b. The deposited thick oxide layer, therefore, provides a protective layer for the underlying FET transistors 304a, 304b.

Figure 3C:
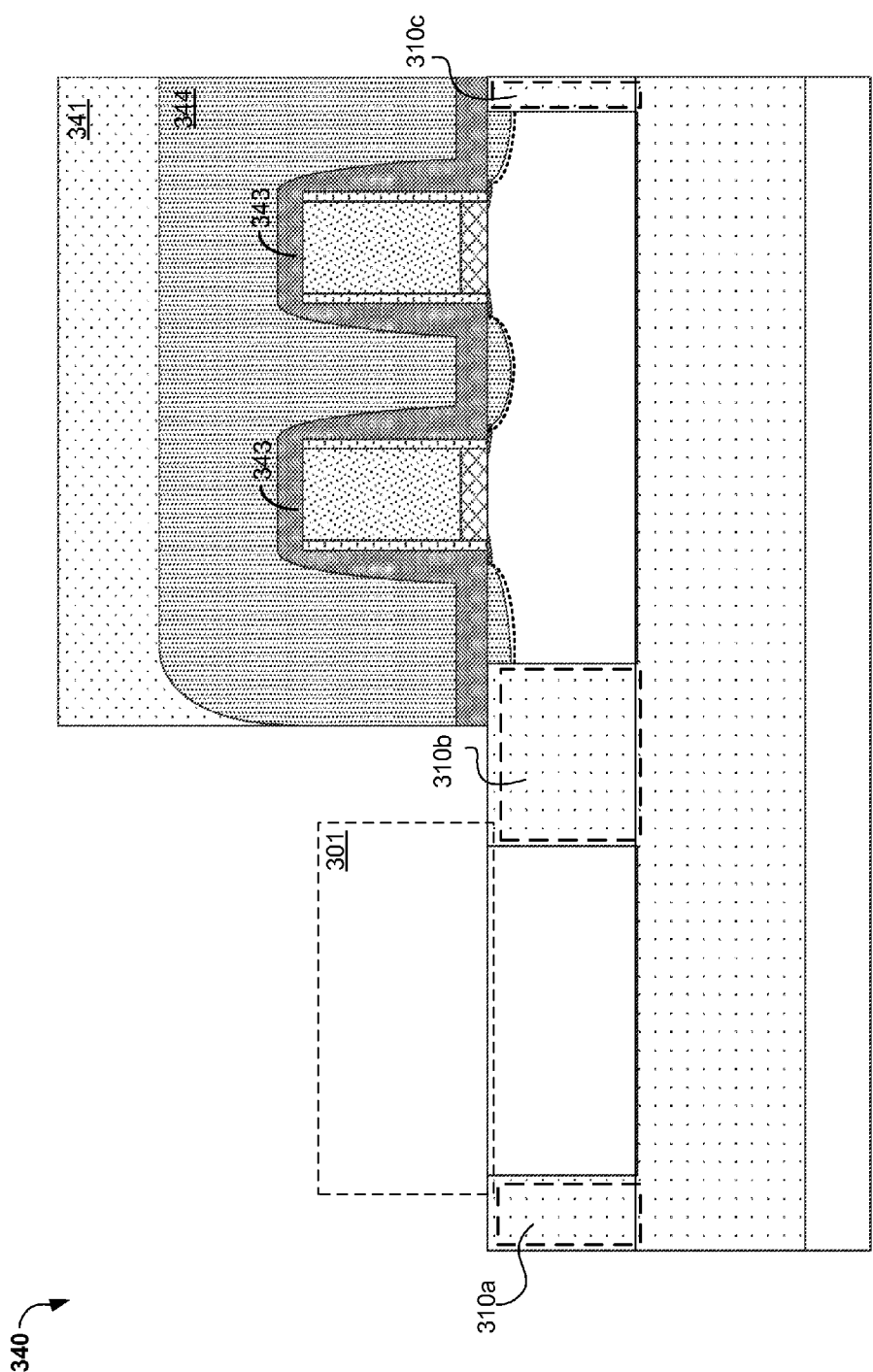

Referring to FIG. 3C, fabrication of integrated photonic device structure 340 includes the etching (e.g., RIE) of a portion of the deposited oxide layer 339 (FIG. 3B) and silicon nitride layer 320 (FIG. 3B) from the photonic device formation region 301 and the STI regions 310a, 310b of integrated photonic device structure 335 (FIG. 3B). As depicted, based on the patterning of a layer of deposited photoresist (not shown), photoresist region 341 protects underlying oxide region or layer 344 and silicon nitride layer 343, whereby the remaining oxide layer (FIG. 3B) and silicon nitride layer (FIG. 3B) covering the photonic device formation region 301 and STI regions 310a, 310b is etched.

Figure 3D:
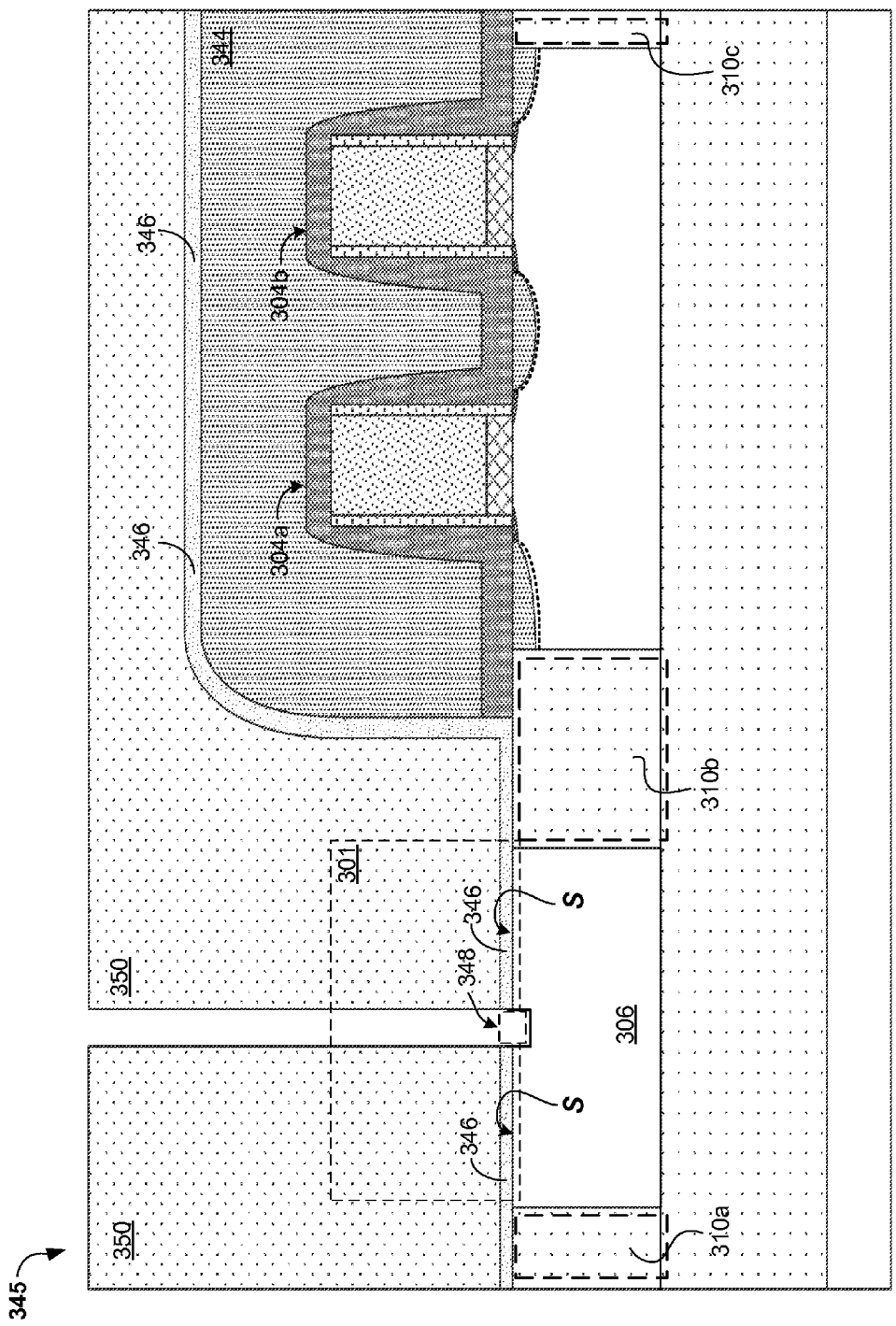

Referring to FIG. 3D, fabrication of integrated photonic device structure 345 includes the formation of a Ge crystallization window region within structure 340 of FIG. 3C. Prior to creating the crystallization window, a silicon nitride layer 346 of approximately 500 Å or less may be formed over the surface S of the photonic device formation region 301, the STI regions 310a, 310b, and the protective oxide layer 344.

As depicted, an opening 348 may be formed within the silicon nitride layer 346 and a surface portion of the optical waveguide 306 by photolithographically patterning resist layer 350. During the subsequent formation of a Ge active region 352 (see FIG. 3F), a portion of the Ge active region fills opening 348 in order for the Ge active region 352 to establish contact with the silicon material of optical waveguide 306. As previously described, such contact may enable the Ge active region 352 to utilize the silicon material of optical waveguide 306 as a seed layer during the crystallization process of the Ge active region at a later process stage.

Figure 3E:
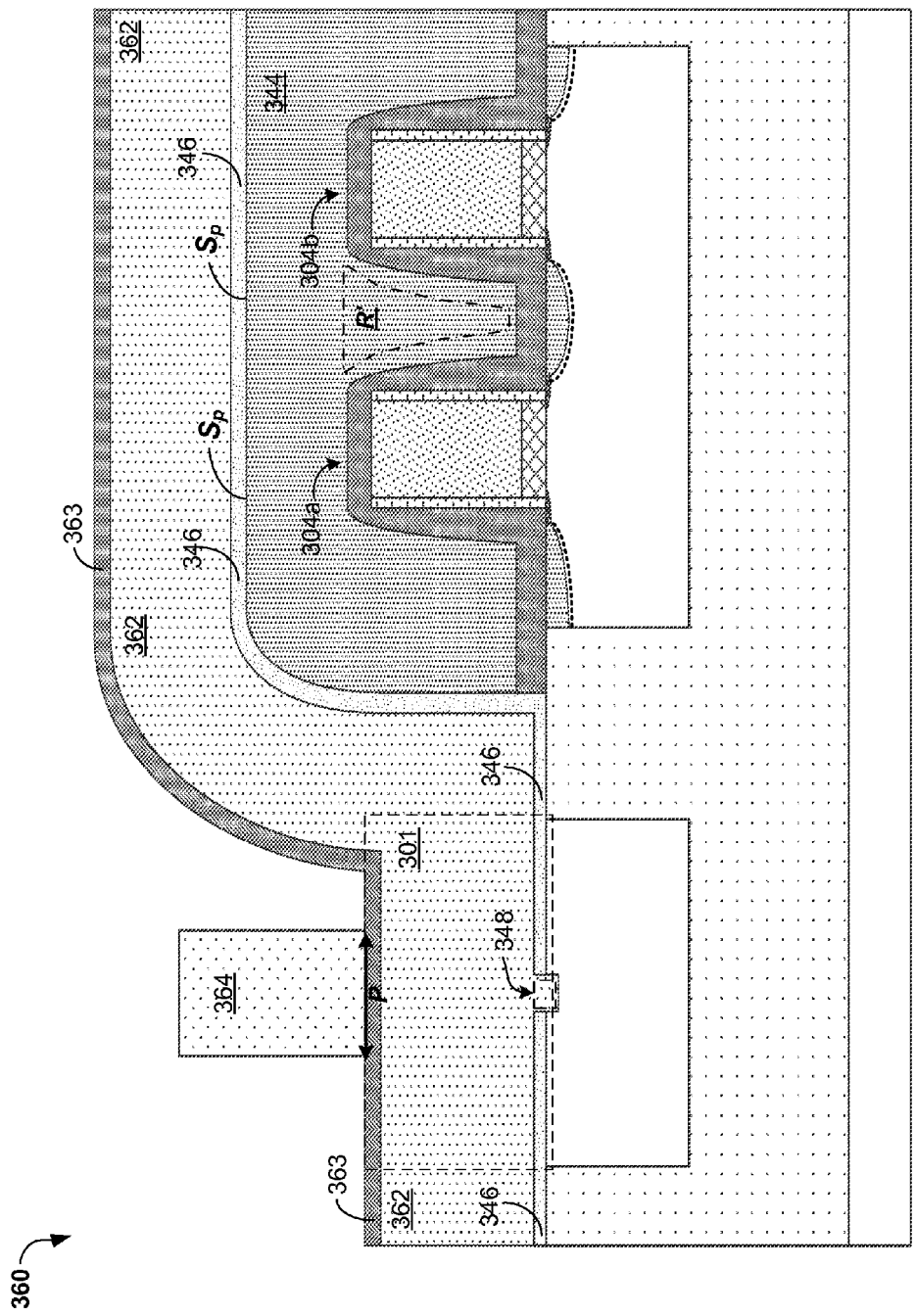

As shown in FIG. 3E, fabrication of integrated photonic device structure 360 includes the formation of a deposited Ge layer over structure 345 of FIG. 3D. In the illustrated embodiment, upon removal of the patterned resist layer 350 (FIG. 3D), a PVD deposition method may be used to deposit a layer of germanium (Ge) 362 both within opening 348 and over silicon nitride layer 346. A silicon nitride ($Si_3N_4$) hard mask layer 363 is also formed over the top surface of the GE layer 362. A photolithographically patterned resist layer 364 is then formed on the hard mask layer 363 over portion P of the photonic device formation region 301. Despite utilizing a PVD deposition process, in contrast to the fabricated structure 135' of FIG. 1D, the Ge layer 362 is deposited with good conformity, such that no gaps or voids are created. This occurs as a result of growing the Ge layer 362 over the substantially planar surface of the protective oxide region 344 rather than within the high aspect ratio region R' located between FET transistors 304a and 304b. For example, as previously indicated, the pitch between the gates of the FET transistors 304a, 304b may be in the region of about 0.14 µm or less. Moreover, as transistor scaling and gate pitch reduces with technological advancement, further increases in aspect ratio may be observed. Deposition of the layer of germanium (Ge) 362 over the oxide region 344 negates such conformity issues, particularly conformity associated with adequately filling high aspect ratio areas located between tightly pitched devices.

Figure 3F:
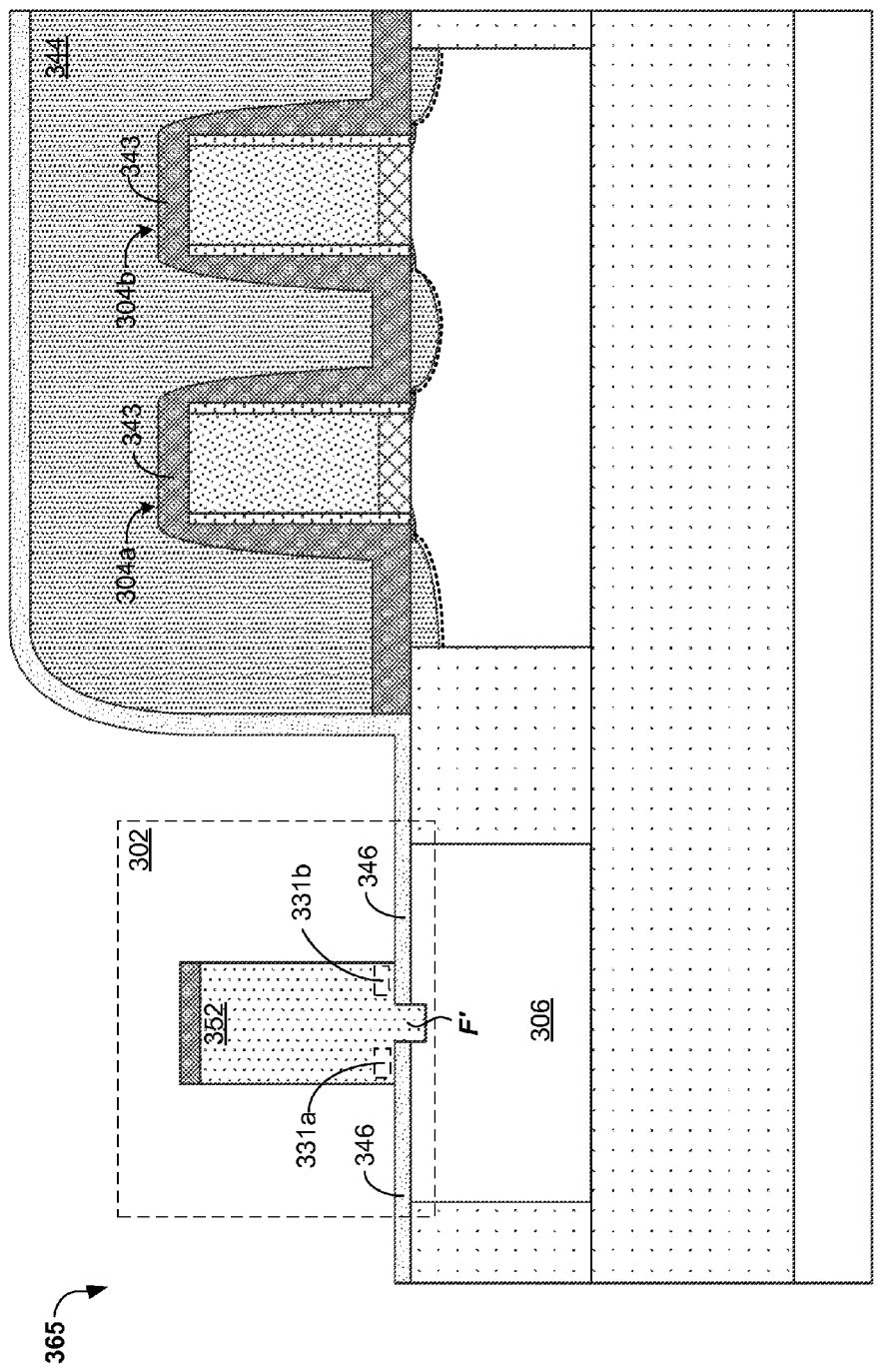

Referring to FIG. 3F, the fabrication of integrated photonic device structure 365 includes the formation of Ge active region 352 by etching the Ge layer 362 (FIG. 3E) of structure 360 (FIG. 2F). The region of the Ge layer 362 (FIG. 3E) located under photo resist layer 364 (FIG. 3E) is protected to form Ge active region 352, while the remaining Ge material is etched away.

As illustrated, portion F' of the bottom portion of the Ge active region 352 may act as a seed layer by contacting the silicon material of the optical waveguide 306. The remaining regions 331a, 331b of the bottom portion of Ge active region 252 may be isolated from the silicon optical waveguide 306 by the silicon nitride layer 346. The isolation between the remaining portions 331a, 331b of the Ge active region 352 and the silicon optical waveguide 306 may facilitate the avoidance of the intermixing of germanium from the Ge active region 352 with the silicon of the optical waveguide 306. As previously indicated, one effect of such intermixing may be to reduce the responsivity of the Ge active region 352 and consequently the formed photodetector 302.

The optical signal traversing within the optical waveguide structure 306 may be received by the active region 352 through the silicon nitride layer 346. Although any received optical signal received by the active region 352 is attenuated by layer 346, based on the thickness of this layer 346, the attenuation is low enough in order to not impede the operation and sensitivity of the photodetector 302.

Figure 3G:
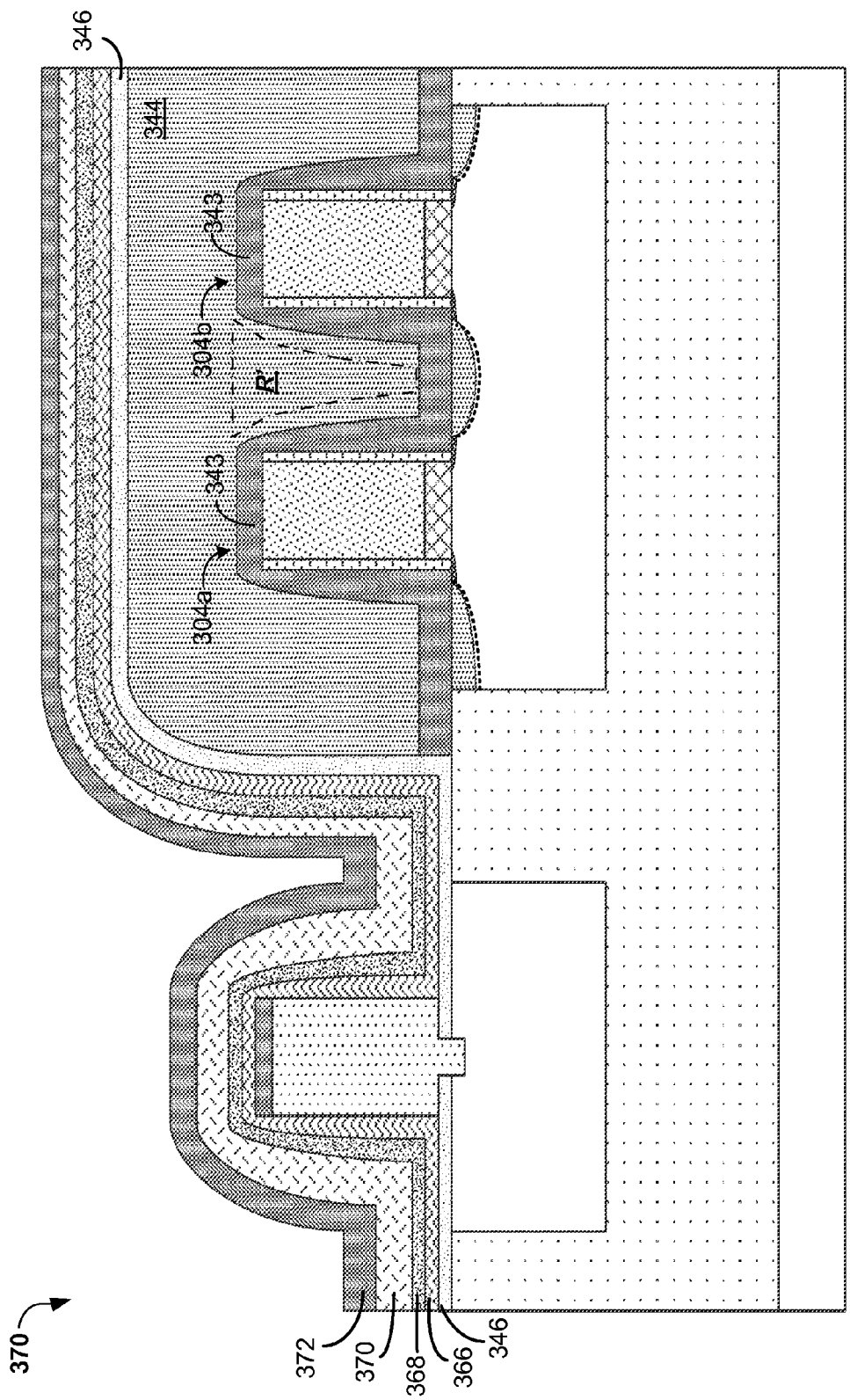

Referring to FIG. 3G, fabricating integrated photonic device structure 370 includes the formation of encapsulating layers 366-372 within structure 365 of FIG. 3F. As illustrated, a silicon nitride layer 366 may be deposited over silicon nitride layer 346 using a low stress plasma enhanced chemical vapor deposition (PECVD) process. The silicon nitride layer 366 may include a thickness in the range of about 100-1000 Å. Preferably, silicon nitride layer 366 may have a thickness of approximately 500 Å and act as a buffer layer for subsequently deposited layers such as, for example, oxide layer 368 and silicon nitride layer 370.

An oxide layer 368 may then be deposited over silicon nitride layer 366 using either a PECVD or a low temperature thermally activated CVD deposition process. The oxide layer 368 may have a thickness in the range of about 100-2000 Å. Preferably, oxide layer 368 may have a thickness of approximately 500 Å and mitigates germanium expansion during the crystallization melt process of the Ge active region 352. A silicon nitride layer 370 may be deposited over oxide layer 368 using a PECVD deposition process. The silicon nitride layer 370 may have a thickness in the range of about 500-3000 Å. Preferably, silicon nitride layer 370 may have a thickness of approximately 1000 Å and mitigates germanium expansion during the crystallization melt process.

Another silicon nitride layer 372 may optionally be deposited over silicon nitride layer 370 using a RTCVD deposition process. The silicon nitride layer 372 may have a thickness in the range of about 500-2000 Å. Preferably, silicon nitride layer 372 may have a thickness of approximately 1000 Å and acts as a sealant of seams and controller of PECVD morphology.

Figure 3H:
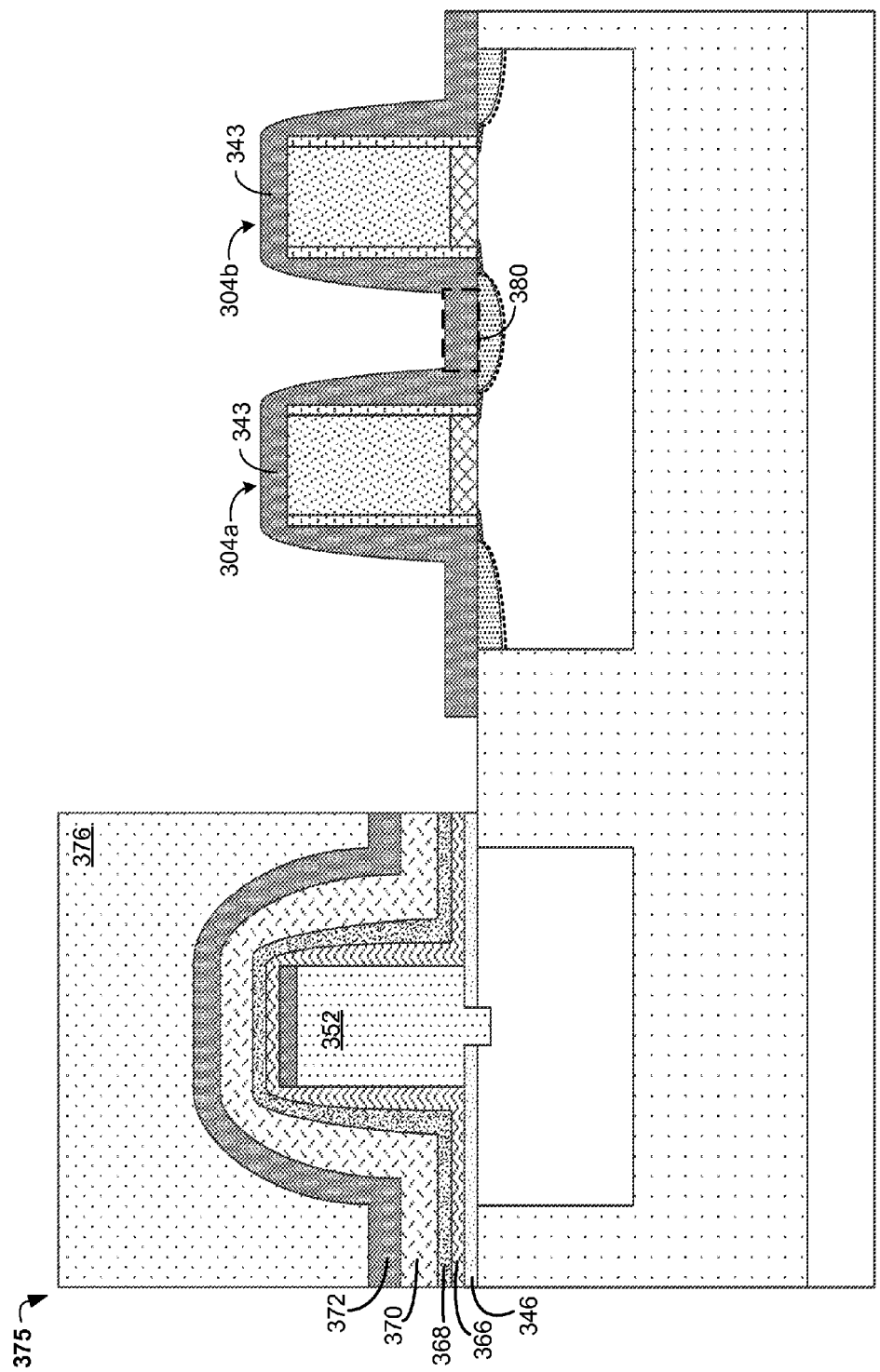
Figure 3I:
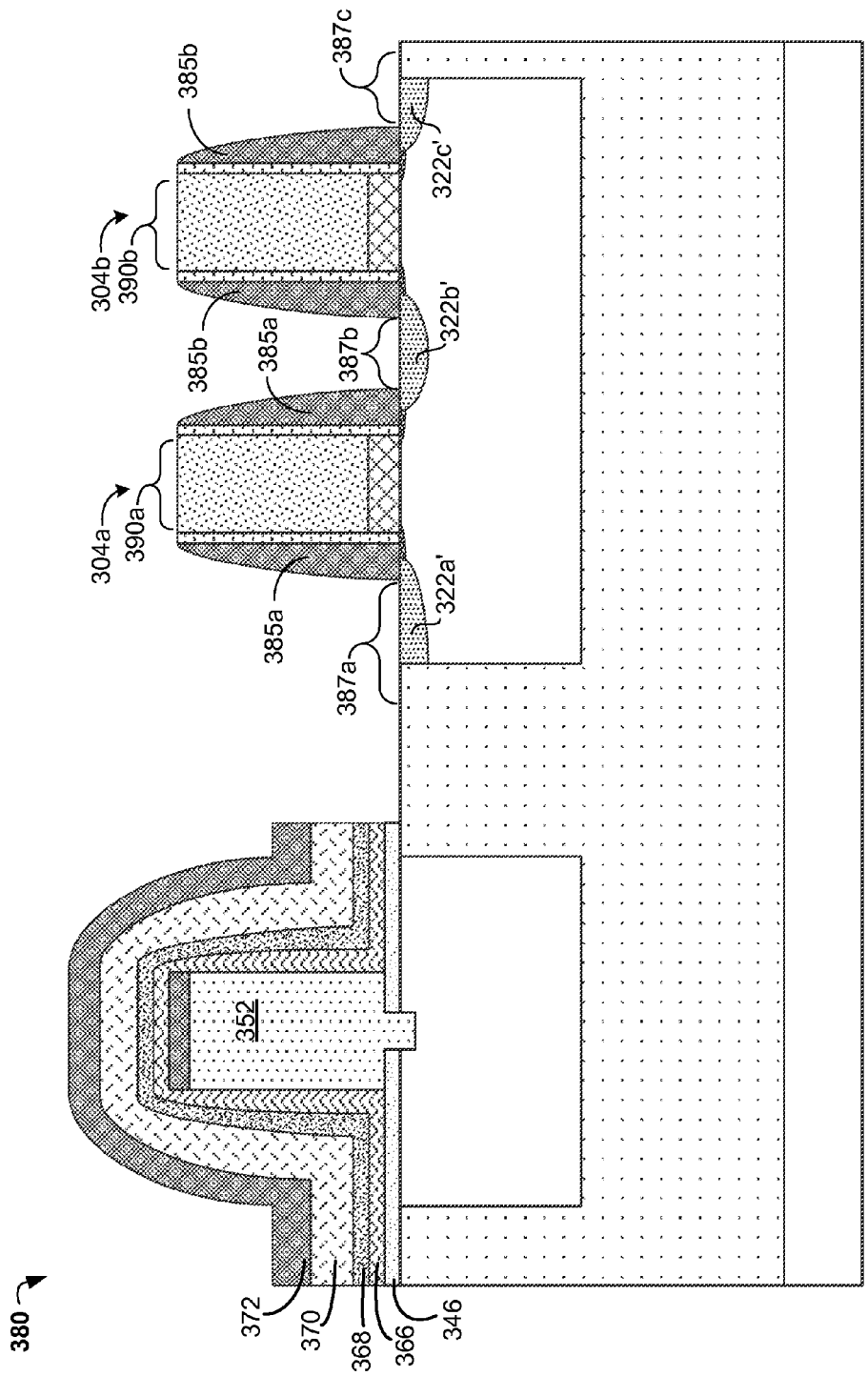

Referring to integrated photonic device structure 375 of FIG. 3H, the formed encapsulating layers 366-372 (FIG. 3G) and silicon nitride layer 346 (FIG. 3G) of structure 370 (FIG. 3G) are etched from over the protective oxide region 344 (FIG. 3G) covering the FET transistors 304a, 304b (FIG. 3G). As depicted in FIG. 3H, the encapsulating layers 366-372 covering the Ge active region 352 remain protected by patterned photoresist layer 376, while the remaining portion of the encapsulating layers 366-372 and the silicon nitride layer 346 are removed.

As shown in FIG. 3G, since the oxide region 344 includes no gaps or voids at location R' between the FET transistors 304a, 304b, any subsequent etching (FIG. 3H) of the encapsulating layers 346-372 does not cause a thinning of the silicon nitride layer 343 (FIG. 3H) forming the nitride spacers of the FET transistors 304a, 304b (FIG. 3H) at region 380 (FIG. 3H).

Further referring to FIG. 3H, the formed oxide region or oxide layer 344 (FIG. 3G) of structure 370 (FIG. 3G) is etched from over the silicon nitride layer 343 of the FET transistors 304a, 304b (FIG. 3G). For example, oxide layer 344 may be removed by an HF wet etch process.

As illustrated in FIG. 3I, fabricating integrated photonic device structure 380 includes forming nitride spacers 385a and 385b from the silicon nitride layer 343 (FIG. 3H) of integrated photonic device structure 375. Portions of the silicon nitride layer 343 (FIG. 3H) are etched to form nitride spacers 385a and 385b. In particular, nitride spacers 385a and 385b are formed by etching regions 387a-387c and regions 390a-390b of the silicon nitride layer 343 (FIG. 3H). Although not shown, the photodetector region is protected with a photoresist layer identical to resist layer 376 (FIG. 3H) during the etching and S/D implant, as well as any other post nitride spacer formation implant processes. As previously indicated, the formed nitride spacers 385a, 385b define the source/drain regions. Thus, after the nitride spacers are formed 385a, 385b, then the S/D implant process (e.g., S/D implant process) occurs to form the S/D regions 322a'-322c' at source/drain (S/D) formation regions 322a-322c (e.g., FIG. 3A).

Figure 3J:
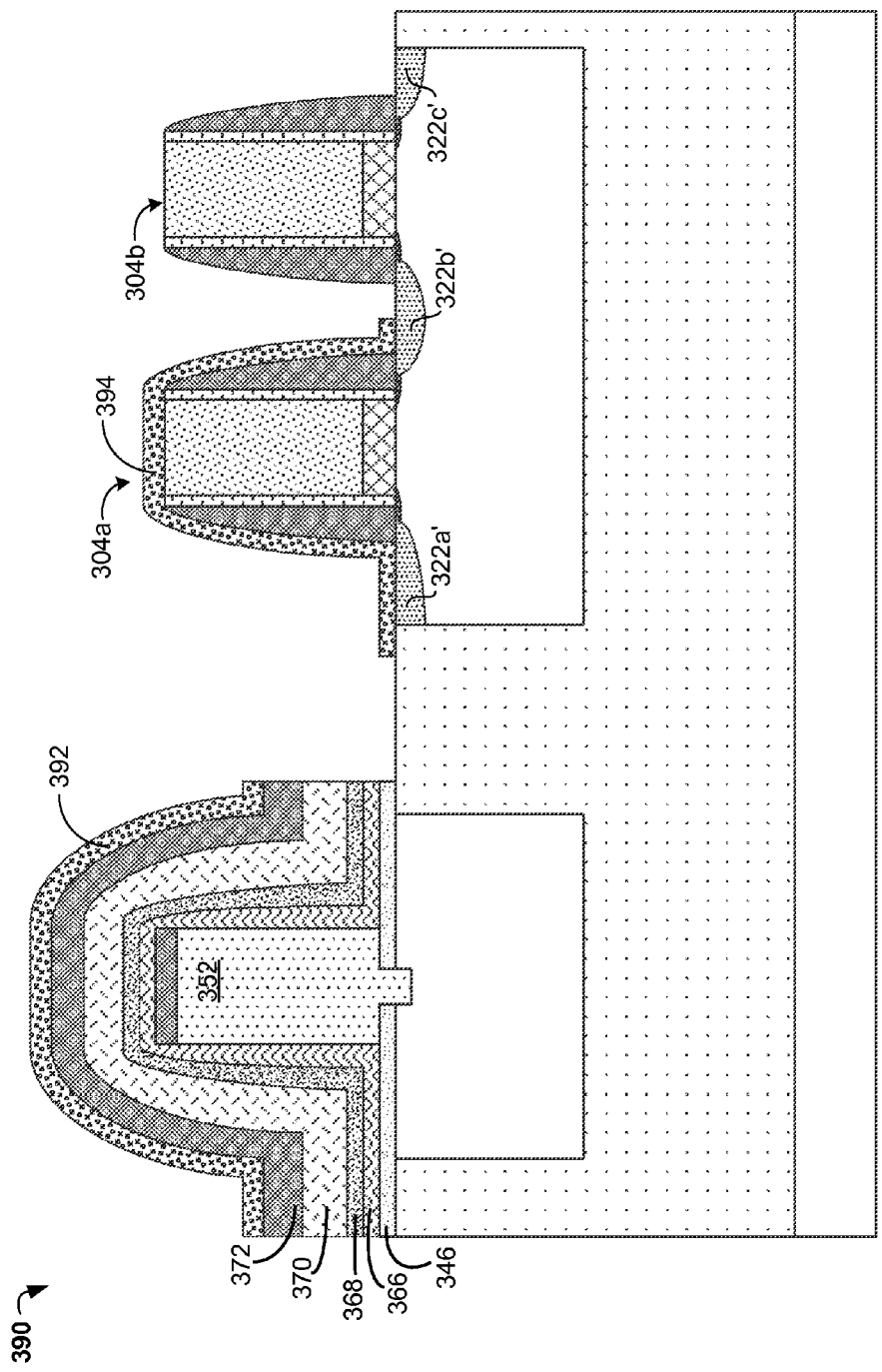

Referring to FIG. 3J, fabricating integrated photonic device structure 390 includes forming additional protective silicon nitride layers 392 and 394 over integrated photonic device structure 380 of FIG. 3I. As depicted, silicon nitride layer 392 is deposited over encapsulating layer 372 in order to protect the underlying Ge active region 352 from contamination caused by silicide clean process chemicals penetrating cracks in the encapsulating layers 366-372. Thus, silicon nitride layer 392 provides an added layer of encapsulating protection for the Ge active layer 352. Similarly, silicon nitride layer 394 may be deposited over one of the FET transistors 304a, 304b in order to protect the FET transistor from a silicide process applied to the other FET transistor. As depicted, for example, silicon nitride layer 394 may be deposited over and protect FET transistor 304a during the siliciding of FET transistor 304b. Layers 392 and 394 can be one continuous layer such that the gap between 392 and 394 is filled in with nitride. However, as depicted, it may be separated.

It may be appreciated that according to an alternative embodiment, FET transistors 304a, 304b (FIG. 3A) may not be fabricated over an active region such as well region 307 (FIG. 3A). For example, FET transistors 304a, 304b (FIG. 3A) may be fabricated over an STI region. In such an embodiment, the degradation, as depicted in FIG. 1H, of the region located between the FET transistors may be more prominently impacted by the etch process since the insulation material of the STI region is more susceptible to the etch process than silicon (e.g., FIG. 1H: well region 107). For example, referring to FIG. 1H, if the FET transistors 104a, 104b are not located over the well region 107, and instead, are fabricated over an STI region (not shown), the etched region 180 (FIG. 1H) would be larger to the extent that some of the STI material under the gate region of the FET transistors 104a, 104b may be removed. In this case, one or both of the FET transistors 104a, 104b may lift-off from the STI surface (not shown).

Accordingly, the foregoing described embodiments may provide, among other things, fabrication processes for forming a protective low temperature oxide layer over adjacent FET transistors in order to protect the FETs during subsequent Ge layer deposition and other processes. Although the conformal deposition of the oxide layers is carried by thermal CVD, the oxide layer deposition occurs using a low temperature CVD in comparison to directly depositing a Ge layer over the FETs using thermal CVD at a higher temperature. Depositing the Ge layer over the FETs using thermal CVD at a higher temperature may adversely affect the underlying FET devices in terms of their respective electrical characteristics. Moreover, the directly deposited Ge layer may include different impurities such as metals, which when directly applied over the FETs using the higher temperature CVD process, can ultimately interact with and, for example, affect the electrical characteristics of the FET transistors. Thus, the foregoing exemplary embodiments depositing an oxide layer over the FETs alleviate, among other things, one or more adverse consequences associated with directly depositing a layer of Ge over adjacent FET transistors.

Figure 4:
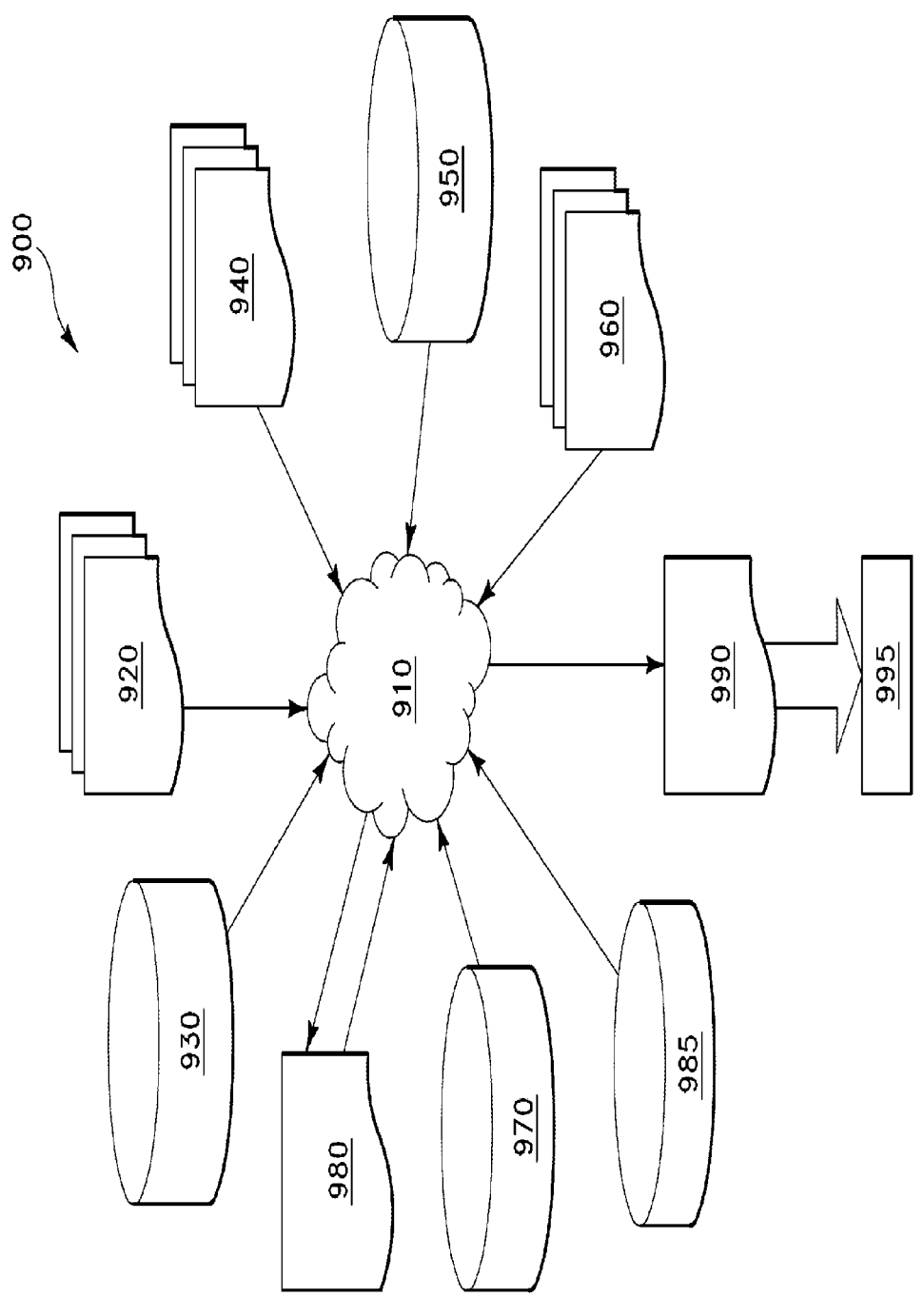
FIG. 4 is a flow diagram of a design process used in semiconductor design, manufacture, and/or test according to an exemplary embodiment.

FIG. 4 shows a block diagram of an exemplary design flow 900 used for example, in semiconductor IC logic design, simulation, test, layout, and manufacture. Design flow 900 includes processes and mechanisms for processing design structures or devices to generate logically or otherwise functionally equivalent representations of the design structures and/or devices described above and shown in FIGS. 2L and 3J. The design structure processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems.

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 4 illustrates multiple such design structures including an input design structure 920 that is preferably processed by a design process 910. In one embodiment, the design structure 920 comprises design data used in a design process and comprising information describing the embodiments of the invention with respect to the structures as shown in FIGS. 2L and 3J. The design data in the form of schematics or HDL, a hardware-description language (e.g., Verilog, VHDL, C, etc.) may be embodied on one or more machine readable media. For example, design structure 920 may be a text file, numerical data or a graphical representation of the embodiments of the invention shown in FIGS. 2L and 3J. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 2L and 3J. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structure shown in FIGS. 2L and 3J to generate a netlist 980 which may contain a design structure such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 20, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990 comprising second design data embodied on a storage medium in a data format used for the exchange of layout data of integrated circuits and/or symbolic data format (e.g. information stored in a GDSII (GDS2), GL1, OASIS, map files, or any other suitable format for storing such design structures). In one embodiment, the second design data resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of the embodiments of the invention shown in FIGS. 2L and 3J. In one embodiment, design structure 990 may comprise a compiled, executable HDL simulation model that functionally simulates the devices shown in FIGS. 2L and 3J.

Design structure 990 may also employ a data format used for the exchange of layout data of integrated circuits and/or symbolic data format (e.g. information stored in a GDSII (GDS2), GL1, OASIS, map files, or any other suitable format for storing such design data structures).

Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce devices or structures as described above and shown in FIGS. 2L and 3J. Design structure 990 may then proceed to a stage 995 where, for example, design structure 990: proceeds to tape-out, is released to manufacturing, is released to a mask house, is sent to another design house, is sent back to the customer, etc.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the one or more embodiments, the practical application or technical improvement over technologies found in the marketplace, or to enable others of ordinary skill in the art to understand the embodiments disclosed herein.

What is claimed is:

1. A method of forming an integrated photonic semiconductor structure having a photonic device and adjacent CMOS devices comprising:
   depositing a first silicon nitride layer over the adjacent CMOS devices;
   depositing an oxide layer over the first silicon nitride layer, wherein the oxide layer conformally covers the first silicon nitride layer and the adjacent CMOS devices to form a substantially planarized surface over the adjacent CMOS devices;
   depositing a second silicon nitride layer over the oxide layer and a region corresponding to forming the photonic device;
   depositing a germanium layer over the oxide layer and the region corresponding to forming the photonic device;
   etching the germanium layer deposited over the adjacent CMOS devices and forming a germanium active layer within the region corresponding to forming the photonic device, wherein the oxide layer and the second silicon nitride layer protect the adjacent CMOS devices during the etching of the germanium;
   depositing encapsulating layers over the germanium active layer and the adjacent CMOS devices; and
   etching the second silicon nitride layer and the encapsulating layers from over the adjacent CMOS devices, wherein during the etching of the second silicon nitride layer and the encapsulating layers, the deposited oxide layer protects the silicon nitride layer deposited over the adjacent CMOS devices, and wherein the depositing of encapsulating layers comprises:
      depositing a first silicon nitride encapsulating layer having a thickness of about 100-1000 Angstroms over the photonic device;
      depositing an oxide encapsulating layer having a thickness of about 100-2000 Angstroms over the deposited first silicon nitride encapsulating layer;
      depositing a second silicon nitride encapsulating layer having a thickness of about 500-3000 Angstroms over the oxide encapsulating layer; and
      depositing a third silicon nitride encapsulating layer having a thickness of about 500-2000 Angstroms over the second silicon nitride encapsulating layer, wherein the deposited first silicon nitride layer, the oxide layer, the second silicon nitride layer, and the third silicon nitride layer encapsulate the photonic device.

2. The method of claim 1, wherein the depositing of the germanium layer comprises using a physical vapor deposition (PVD) process.

3. The method of claim 1, wherein the protecting of the silicon nitride layer deposited over the adjacent CMOS devices comprises protecting source/drain dopant regions corresponding to the adjacent CMOS devices.

4. The method of claim 1, wherein the oxide layer comprises a silicon dioxide material having a thickness of about 500-4000 Angstroms.

5. The method of claim 1, wherein the deposited germanium comprises a thickness of about 500-3000 Angstroms.

6. The method of claim 1, wherein the photonic device comprises a photodetector device.

7. A method of forming an integrated photonic semiconductor structure having a photonic device and adjacent CMOS devices comprising:
    depositing an oxide layer over a spacer layer corresponding to the adjacent CMOS devices, wherein the oxide layer conformally covers the spacer layer deposited over the adjacent CMOS devices and between a pitch of the adjacent CMOS devices to form a substantially planarized surface above a top surface of the adjacent CMOS devices;
    depositing a silicon nitride layer over the oxide layer forming the substantially planarized surface above the top surface of the adjacent CMOS devices and a region corresponding to forming the photonic device;
    depositing, using a physical vapor deposition (PVD) process, a germanium layer over the oxide layer and the region corresponding to forming the photonic device, wherein the substantially planarized surface of the oxide layer that is formed above the top surface of the adjacent CMOS devices protects the pitch from the depositing of the germanium layer within the pitch and an occurrence of voiding between the pitch of the adjacent CMOS devices; and
    etching the deposited germanium layer deposited over the adjacent CMOS devices and forming a germanium active layer within the region corresponding to forming the photonic device, wherein the oxide layer protects the adjacent CMOS devices during the etching of the germanium.

8. The method of claim 7, further comprising creating an opening in the deposited silicon nitride layer within the region corresponding to forming the photonic device, wherein the opening creates a crystallization window for crystallization of the formed germanium active layer.

9. The method of claim 7, further comprising;
    depositing encapsulating layers over the germanium active layer and the adjacent CMOS devices;
    etching the second silicon nitride layer and the encapsulating layers from over the adjacent CMOS devices, wherein during the etching of the second silicon nitride layer and the encapsulating layers, the deposited oxide layer protects the spacer layer deposited over the adjacent CMOS devices.

10. The method of claim 7, wherein the protecting of the spacer layer deposited over the adjacent CMOS devices comprises protecting subsequently formed source/drain dopant regions corresponding to the adjacent CMOS devices.

11. The method of claim 9, wherein the depositing of encapsulating layers comprises:
    depositing a first silicon nitride encapsulating layer over the photonic device;
    depositing an oxide encapsulating layer over the deposited first silicon nitride encapsulating layer;
    depositing a second silicon nitride encapsulating layer over the oxide encapsulating layer; and
    depositing a third silicon nitride encapsulating layer over the second silicon nitride encapsulating layer.

12. The method of claim 11, wherein the deposited first silicon nitride encapsulating layer, the oxide encapsulating layer, the second silicon nitride encapsulating layer, and the third silicon nitride encapsulating layer encapsulate the photonic device.

13. The method of claim 11, wherein:
    the first silicon nitride encapsulating layer includes a thickness of about 100-1000 Angstroms;
    the oxide encapsulating layer includes a thickness of about 100-2000 Angstroms;
    the second silicon nitride encapsulating layer includes a thickness of about 500-3000 Angstroms; and
    the third silicon nitride encapsulating layer includes a thickness of about 500-2000 Angstroms.

14. The method of claim 7, wherein the oxide layer comprises a silicon dioxide material having a thickness of about 500-4000 Angstroms.

15. The method of claim 7, wherein the deposited germanium comprises a thickness of about 500-3000 Angstroms.

16. The method of claim 1, wherein the depositing of the germanium layer comprises using a physical vapor deposition (PVD) process.

17. An integrated photonic semiconductor structure comprising:
    a substrate;
    a photonic device located on the substrate, the photonic device having an active region;
    a first silicon nitride layer located on the substrate between the active region and an optical waveguide within the substrate, wherein the first silicon nitride layer mitigates intermixing between the active region and the optical waveguide;
    adjacent CMOS devices located on the substrate and electrically isolated from the photonic device;
    encapsulating layers located over the active region and encapsulating the active region;
    a second silicon nitride layer located on the substrate that covers at least one of the adjacent CMOS devices and the encapsulating layers,
    wherein the second silicon nitride layer protects the at least one of the adjacent CMOS devices and the encapsulating layers during silicide processes, the first and the second silicon nitride layer separated from each other on the substrate, and wherein the encapsulating layers comprise:
        a first silicon nitride encapsulating layer having a thickness of about 100-1000 Angstroms over the photonic device;
        an oxide encapsulating layer having a thickness of about 100-2000 Angstroms over the deposited first silicon nitride encapsulating layer;
        a second silicon nitride encapsulating layer having a thickness of about 500-3000 Angstroms over the oxide encapsulating layer; and
        a third silicon nitride encapsulating layer having a thickness of about 500-2000 Angstroms over the second silicon nitride encapsulating layer, wherein the deposited first silicon nitride layer, the oxide layer, the second silicon nitride layer, and the third silicon nitride layer encapsulate the photonic device.

18. The structure of claim 17, wherein the substrate includes one of the group consisting of a silicon-on-insulator (SOI) substrate and a silicon-on-sapphire (SOS) substrate.

19. The structure of claim 17, wherein the oxide layer comprises a silicon dioxide material having a thickness of about 500-4000 Angstroms.

20. The structure of claim 17, wherein the deposited germanium comprises a thickness of about 500-3000 Angstroms.

21. The structure of claim 17, wherein:
the first silicon nitride layer comprises a thickness of about less than 500 Angstroms; and
the second silicon nitride layer comprises a thickness of about less than 1000 Angstroms.

22. A design structure tangibly embodied in a non-transitory machine readable medium for designing, manufacturing, or testing an integrated circuit, the design structure comprising:
a substrate;
a photonic device located on the substrate, the photonic device having an active region;
a first silicon nitride layer located on the substrate between the active region and an optical waveguide within the substrate, wherein the first silicon nitride layer mitigates intermixing between the active region and the optical waveguide;
adjacent CMOS devices located on the substrate and electrically isolated from the photonic device;
encapsulating layers located over the active region and encapsulating the active region;
a second silicon nitride layer located on the substrate, the second silicon nitride layer covering at least one of the adjacent CMOS devices and the encapsulating layers;
wherein the second silicon nitride layer protects the at least one of the adjacent CMOS devices and the encapsulating layers during silicide processes, the first and the second silicon nitride layer separated from each other on the substrate, and wherein the encapsulating layers comprise:
a first silicon nitride encapsulating layer having a thickness of about 100-1000 Angstroms over the photonic device;
an oxide encapsulating layer having a thickness of about 100-2000 Angstroms over the deposited first silicon nitride encapsulating layer;
a second silicon nitride encapsulating layer having a thickness of about 500-3000 Angstroms over the oxide encapsulating layer; and
a third silicon nitride encapsulating layer having a thickness of about 500-2000 Angstroms over the second silicon nitride encapsulating layer, wherein the deposited first silicon nitride layer, the oxide layer, the second silicon nitride layer, and the third silicon nitride layer encapsulate the photonic device.

\* \* \* \* \*